US011776960B2

(12) United States Patent
Khaderbad et al.

(10) Patent No.: US 11,776,960 B2
(45) Date of Patent: Oct. 3, 2023

(54) GATE STRUCTURES FOR STACKED SEMICONDUCTOR DEVICES

(71) Applicant: Taiwan Semiconductor Manufacturing Co., Ltd., Hsinchu (TW)

(72) Inventors: Mrunal Abhijith Khaderbad, Hsinchu (TW); Sathaiya Mahaveer Dhanyakumar, Hsinchu (TW); Huicheng Chang, Tainan (TW); Keng-Chu Lin, Ping-Tung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/461,329

(22) Filed: Aug. 30, 2021

(65) Prior Publication Data

US 2023/0062940 A1    Mar. 2, 2023

(51) Int. Cl.
*H01L 27/092*    (2006.01)
*H01L 21/8238*    (2006.01)

(52) U.S. Cl.
CPC .. *H01L 27/0924* (2013.01); *H01L 21/823821* (2013.01)

(58) Field of Classification Search
CPC ......... H01L 27/0924; H01L 21/823821; H01L 29/66439; H01L 29/78696; H01L 29/42392
See application file for complete search history.

(56) References Cited

U.S. PATENT DOCUMENTS

| 11,069,684 | B1* | 7/2021 | Xie | H01L 21/823871 |
| 2020/0105891 | A1* | 4/2020 | Lilak | H01L 24/17 |
| 2021/0210349 | A1* | 7/2021 | Xie | H01L 21/76224 |
| 2021/0296184 | A1* | 9/2021 | Xie | H01L 29/0673 |

* cited by examiner

*Primary Examiner* — Karen Kusumakar
*Assistant Examiner* — Adam S Bowen
(74) *Attorney, Agent, or Firm* — Sterne, Kessler, Goldstein & Fox P.L.L.C.

(57) ABSTRACT

The present disclosure describes a semiconductor device and methods for forming the same. The semiconductor device includes a first transistor device of a first type and a second transistor device of a second type. The first transistor device includes first nanostructures, a first pair of source/drain structures, and a first gate structure on the first nanostructures. The second transistor device of a second type is formed over the first transistor device. The second transistor device includes second nanostructures over the first nanostructures, a second pair of source/drain structures over the first pair of source/drain structures, and a second gate structure on the second nanostructures and over the first nanostructures. The semiconductor device further includes a first isolation structure in contact with the first and second nanostructures and a second isolation structure in contact with a top surface of the first pair of source/drain structures.

20 Claims, 22 Drawing Sheets

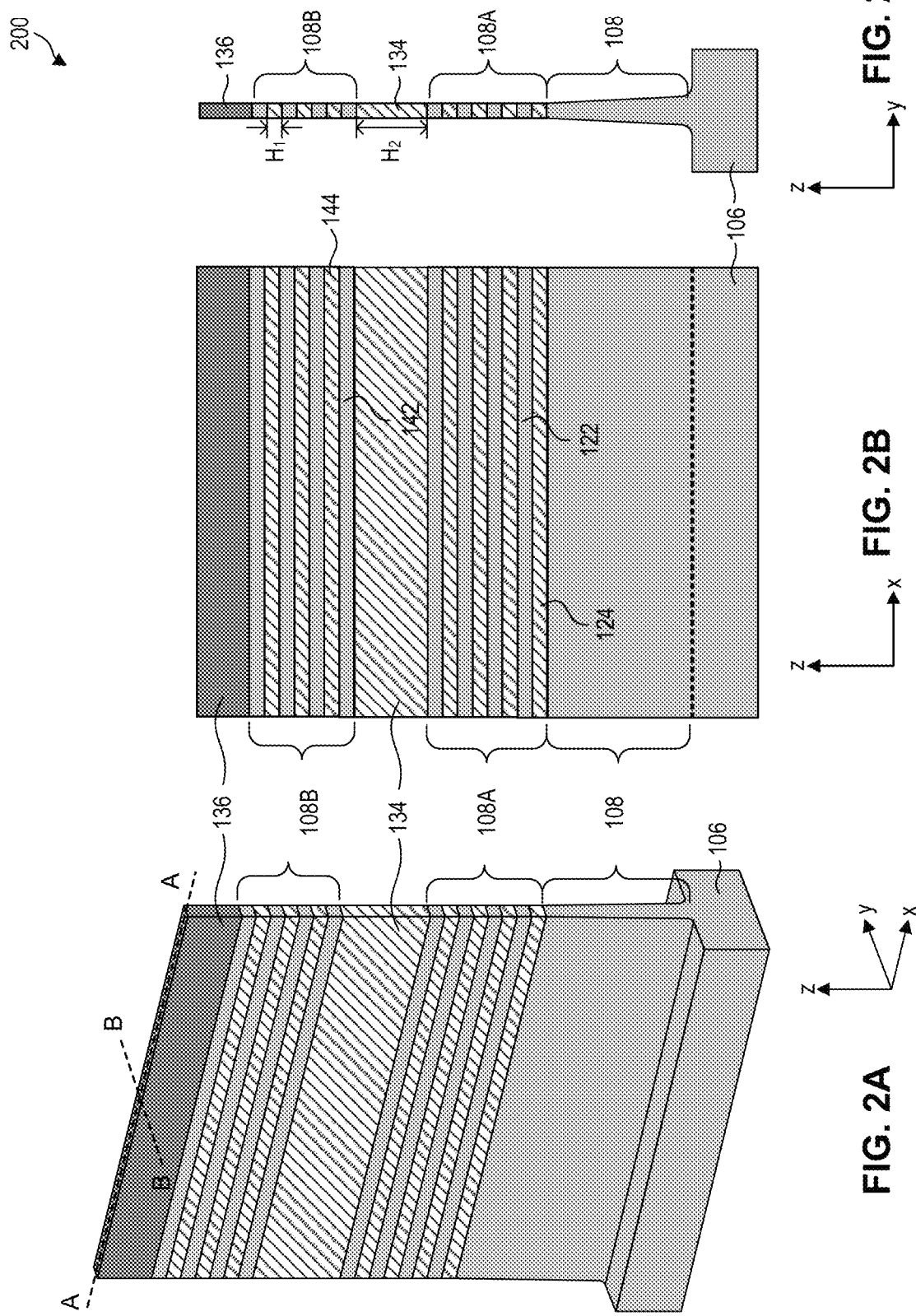

GATE STRUCTURES FOR STACKED SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices and three-dimensional transistors, such as gate-all-around (GAA) field effect transistors and fin field effect transistors (finFETs), are introduced.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 2A-2C, 3A, 3B, and 4-11 illustrate various cross-sectional views of semiconductor devices at various stages of their fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
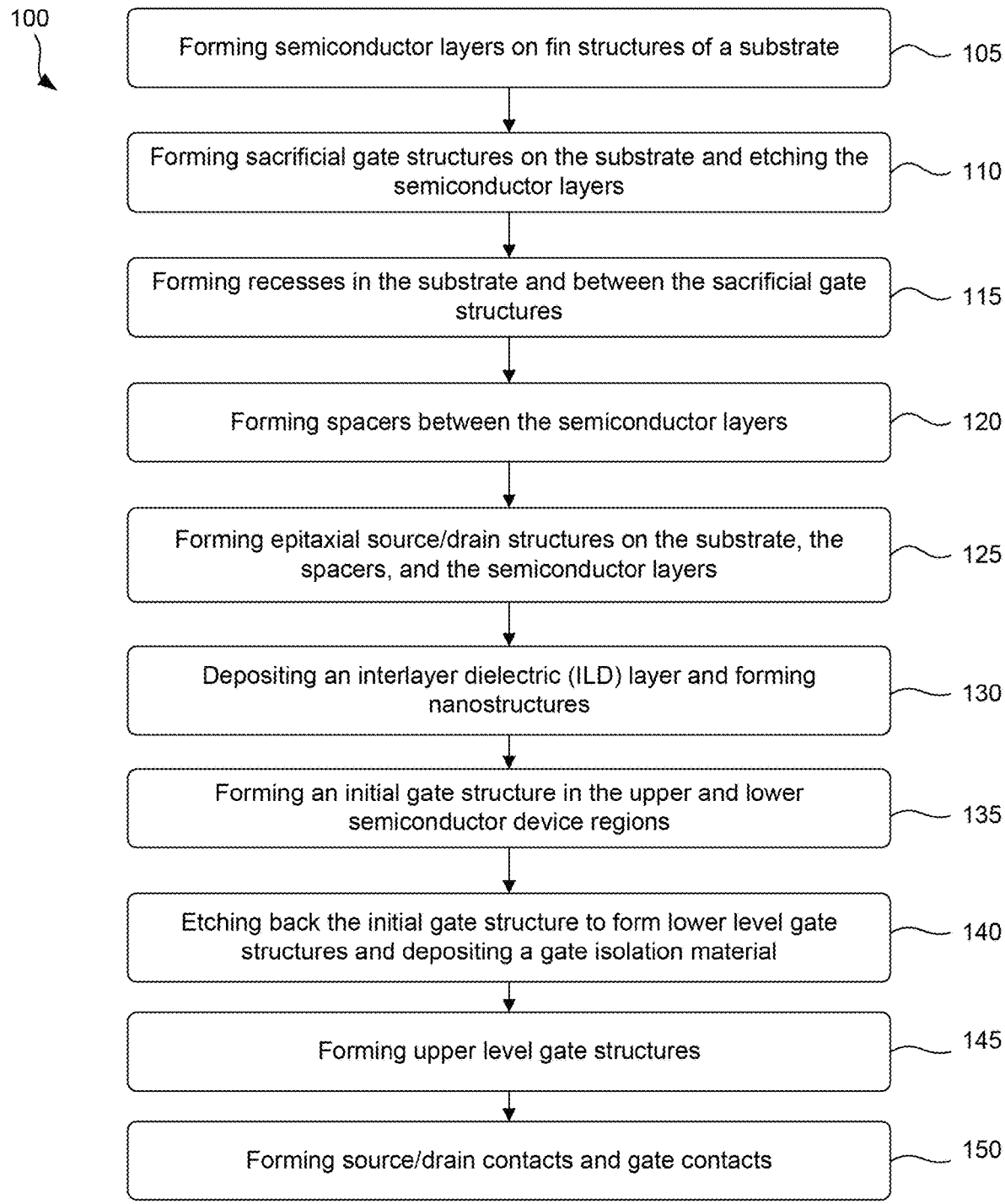
FIG. 1 is a flow diagram of a method for fabricating stacked semiconductor devices, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate, such as a semiconductor wafer, or (ii) built with vertical structures.

The term "FinFET" refers to a FET formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of the value (e.g., ±1%, ±2%, ±3%, ±4%, ±5% of the value), 10% of the value, 20% of the value, etc.

The terms "vertical direction" and "horizontal direction" respectively refer to z-direction and x-direction as illustrated in the figures herein.

The present disclosure provides example field effective transistor (FET) devices (e.g., gate-all-around (GAA) FETs, fin-type FET (finFETs), horizontal or vertical GAA finFETs, or planar FETs) in a semiconductor device and/or in an integrated circuit (IC) and example methods for fabricating the same.

Epitaxially grown materials are implemented in semiconductor devices to increase device speed and reduce device power consumption. For example, source/drain terminals of transistor devices formed of doped epitaxial materials can provide benefits, such as enhanced carrier mobility and improved device performance. Epitaxial source/drain terminals can be formed by epitaxially disposing crystalline material using a seed layer. As the semiconductor industry continues to scale down the dimensions of semiconductor devices, circuit complexity has increased at all device levels. For example, beyond the 5 nm technology node or the 3 nm technology node, increased source/drain tunneling can increase leakage current. Short channel effects can also be one of the reasons for device failure. Semiconductor devices implementing nanostructures, such as nanowires, are potential candidates to overcome the short channel effects. Among them, GAA transistor devices can reduce short channel effects and enhance carrier mobility, which in turn improve device performance. However, it has become increasingly challenging to further increase device density. For example, adjacent gate structures in stacked semiconductor devices can be challenging to fabricate due to the high aspect ratio between adjacent spacers and can suffer from undesirable cross-talk due to insufficient isolation.

Various embodiments in the present disclosure describe methods for forming stacked semiconductor devices having stacked gate structures and gate isolation structures. The stacked semiconductor devices can include an upper level semiconductor device (e.g., an n-type GAAFET device)

stacked on top of a lower level semiconductor device (e.g., a p-type GAAFET device). In some embodiments, a p-type FET device can be stacked over an n-type FET device. In some embodiments, the GAAFETs can implement nanostructures, such as nanowires and nanosheets, with spacers and gate structures formed between the adjacent nanostructures. Isolation structures are formed between the first and second types of semiconductor devices to provide as physical and electrical barriers for reducing cross-talk between devices. For example, one or more gate isolation structures can be formed between vertically-stacked gate structures for the upper and lower level semiconductor devices. Gate structures for the upper and lower level semiconductor devices can be formed by a multi-step gate formation process. In some embodiments, nanostructures for both upper and lower level semiconductor devices can be released (e.g., exposed by removing covering material) and an initial gate structure is formed for both upper and lower level semiconductor devices. The initial gate structure formed on the upper level semiconductor devices can be removed and replaced with an upper level gate structure. The remaining initial gate structure in the lower level semiconductor devices can form the lower level gate structure. In some embodiments, nanostructures for the upper and lower level semiconductor devices can be selectively released in separate fabrication steps followed by the formation of upper and lower level gate structures, respectively. Stacked semiconductor devices with stacked gate structures described herein provide various benefits that can improve device performance, reliability, and yield. Benefits can include, but are not limited to, improved isolation between gate structures of stacked gates, improved channel quality, among other things. The embodiments described herein use GAAFETs as examples and can be applied to other semiconductor structures, such as finFETs. In addition, the embodiments described herein can be used in various technology nodes, such as 14 nm, 7 nm, 5 nm, 3 nm, 2 nm, and other technology nodes.

FIG. 1 is a flow diagram of a method 100 for fabricating a stacked semiconductor device incorporating stacked gate structures, according to some embodiments. For illustrative purposes, the operations illustrated in FIG. 1 will be described with reference to the example fabrication processes of fabricating semiconductor devices as illustrated in FIGS. 2A-2C, 3A, 3B, and 4-21. Operations can be performed in a different order or not performed depending on specific applications. It should be noted that method 100 may not produce a complete semiconductor device. Accordingly, it is understood that additional processes can be provided before, during, and after method 100, and that some other processes may only be briefly described herein.

Referring to FIG. 1, in operation 105, semiconductor layers are formed on fin structures of a substrate, according to some embodiments. For example, lower layer stack 108A and upper layer stack 108B can be formed on fins 108 as described with reference to semiconductor device 200 illustrated in FIGS. 2A-2C. FIG. 2B is a cross-sectional view of the structure in FIG. 2A as viewed from the A-A line. FIG. 2C is a cross-sectional view of the structure in FIG. 2A as viewed from the B-B line.

Substrate 106 can be a semiconductor material, such as silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Fin 108 extends along an x-axis. Fin 108 can be a part of substrate 106 and can include material similar to substrate 106. Fin 108 can be formed from a photolithographic patterning and an etching of substrate 106.

Lower layer stack 108A and upper layer stack 108B can each include a stack of semiconductor layers. Depending on the types of semiconductor devices formed, one group of semiconductor layers can be subsequently processed to form a channel region underlying subsequently-formed gate structures. Another group of semiconductor layers are sacrificial layers that will be removed for gate structure formation. Lower layer stack 108A can include a first group of semiconductor layers 122 and a second group of semiconductor layers 124 stacked in an alternating configuration. Each of semiconductor layers 122 and 124 can be epitaxially grown on its underlying layer and can include semiconductor materials different from each other. In some embodiments, semiconductor layers 122 and 124 can include semiconductor materials similar to or different from substrate 106. In some embodiments, semiconductor layers 122 and 124 can include semiconductor materials with oxidation rates and/or etch selectivity different from each other. In some embodiments, each of semiconductor layers 122 can be formed of silicon and each of semiconductor layers 124 can be formed of silicon germanium (SiGe). In some embodiments, semiconductor layers 122 can be formed of silicon germanium and semiconductor layers 124 can be formed of silicon. In some embodiments, semiconductor layers 124 and semiconductor layers 144 can have a germanium atomic concentration between about 15% and about 35%. For example, the germanium atomic concentration can be between about 20% and about 30%. A thickness $H_1$ of semiconductor layers 122, 124, 142, and 144 can be between about 2 nm and about 15 nm. For example, thickness $H_1$ can be between about 3 nm and about 12 nm, between about 5 nm and about 10 nm, or any suitable thicknesses. Thickness of semiconductor layers 122, 124, 142, and 144 can be similar or different, depending on device design. Semiconductor layers 122 and/or semiconductor layers 124 can be undoped or can be in-situ doped during their epitaxial growth process using (i) p-type dopants, such as boron, indium, and gallium; and/or (ii) n-type dopants, such as phosphorus and arsenic. For p-type in-situ doping, p-type doping precursors, such as diborane ($B_2H_6$), boron trifluoride ($BF_3$), and any other p-type doping precursor, can be used. For n-type in-situ doping, n-type doping precursors, such as phosphine ($PH_3$), arsine ($AsH_3$), and any other n-type doping precursor, can be used. Though four layers for each of semiconductor layers 122 and semiconductor layers 124 are shown in FIGS. 2A-2C, semiconductor device 200 can have any suitable number of semiconductor layers 122 and semiconductor layers 124. Upper layer stack 108B can include semiconductor layers 142 and 144 that can be similar to semiconductor layers 122 and 124, respectively. For example, upper layer stack 108B can be formed using similar materials as lower layers stack 108A. In some embodiments, semiconductor layers 144 can be formed using silicon germanium. In some embodiments, semiconductor layers 144 can be formed with silicon carbide or a compound including silicon, germanium, and tin. In some embodiments, upper layer stack 108B can be formed using different materials. For example, semiconductor layers 124 and 144 can be formed of silicon germanium material and have different germanium atomic concentrations. In some embodiments, semiconductor layers 122 and 144 can be formed of different materials.

Isolation structure 134 can be formed between lower layer stack 108A and upper layer stack 108B. In some embodiments, isolation structure 134 can be formed using material similar to one or more of semiconductor layers 122, 124, 142, and 144. For example, isolation structure 134 can be formed using silicon germanium material. In some embodiments, isolation structure 134 can be formed using silicon carbide or a compound including silicon, germanium, and tin. In some embodiments, isolation structure 134 can have a germanium atomic concentration similar to semiconductor layers 124 and/or semiconductor layers 144. For example, isolation structure 134 can have a germanium atomic concentration between about 15% and about 35%, between about 20% and about 30%, or any suitable concentrations. In some embodiments, isolation structure 134 can be formed of a low-k dielectric material (e.g., dielectric material having a dielectric constant lower than about 3.9) or any suitable dielectric materials. For example, isolation structure 134 can be formed of silicon oxide. Isolation structure 134 can be formed using suitable deposition methods, such as low-pressure chemical vapor deposition (LPCVD) and plasma-enhanced chemical vapor deposition (PECVD). In some embodiments, isolation structure 134 can have a thickness $H_2$ between about 30 nm and about 120 nm. For example, thickness $H_2$ can be between about 35 nm and about 115 nm, between about 40 nm and about 110 nm, between about 50 nm and about 100 nm, or any suitable thicknesses.

Forming lower layer stack 108A and upper layer stack 108B can include forming a stack of materials for semiconductor layers 122 and 124 on substrate 106, depositing an isolation material for isolation structure 134, forming another stack of materials for semiconductor layers 142 and 144, and etching a portion of substrate 106 and the stack of materials through patterned hard mask layer 136 formed on the stack of materials. In some embodiments, hard mask layer 136 can be formed of silicon nitride using, for example, LPCVD or PECVD deposition methods. The etching of the stack of materials can include a dry etch, a wet etch process, or a combination thereof. In some embodiments, hard mask layer 136 can be removed after lower layer stack 108A and upper layer stack 108B are formed.

Figure 3A:
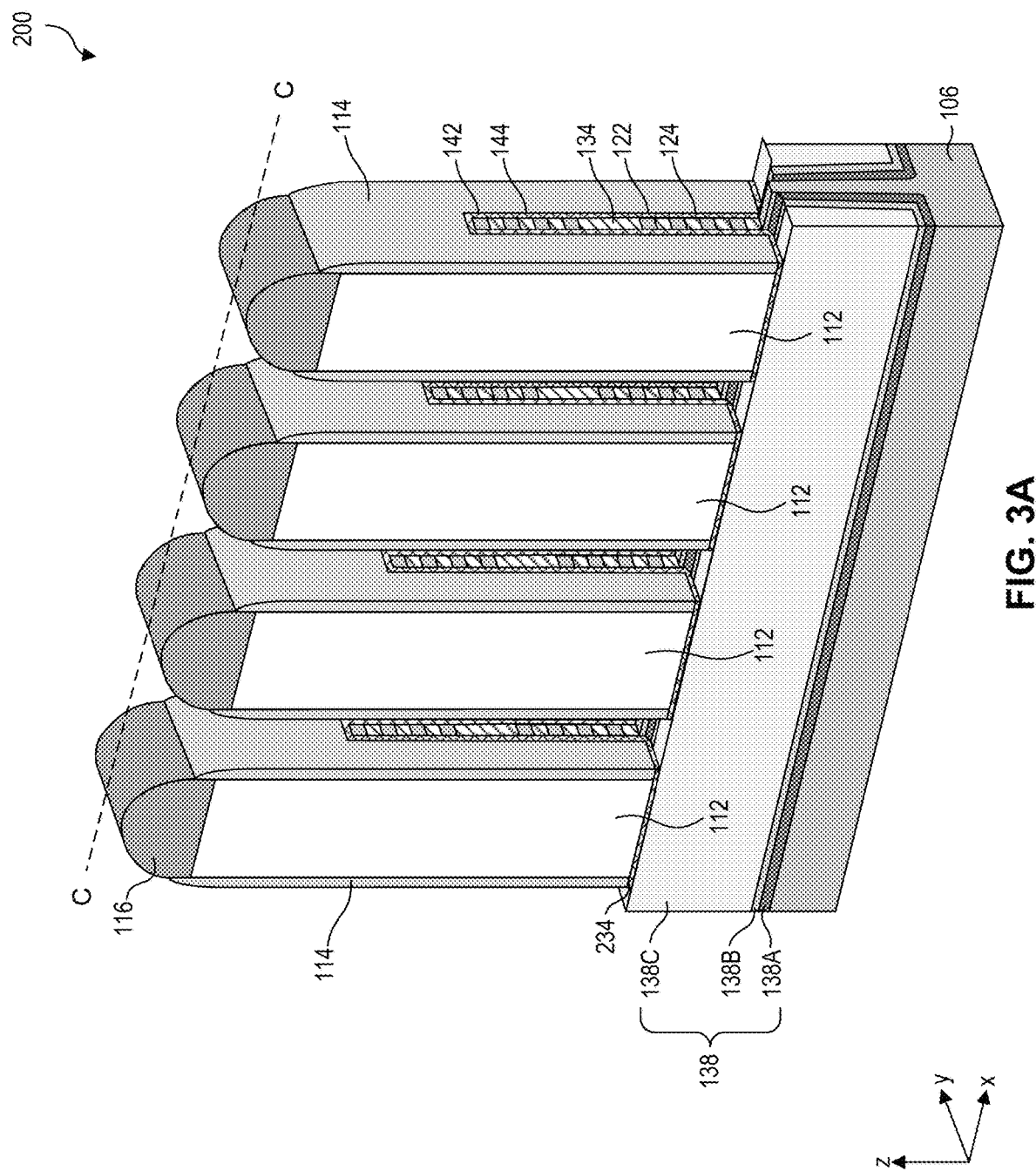
Figure 3B:
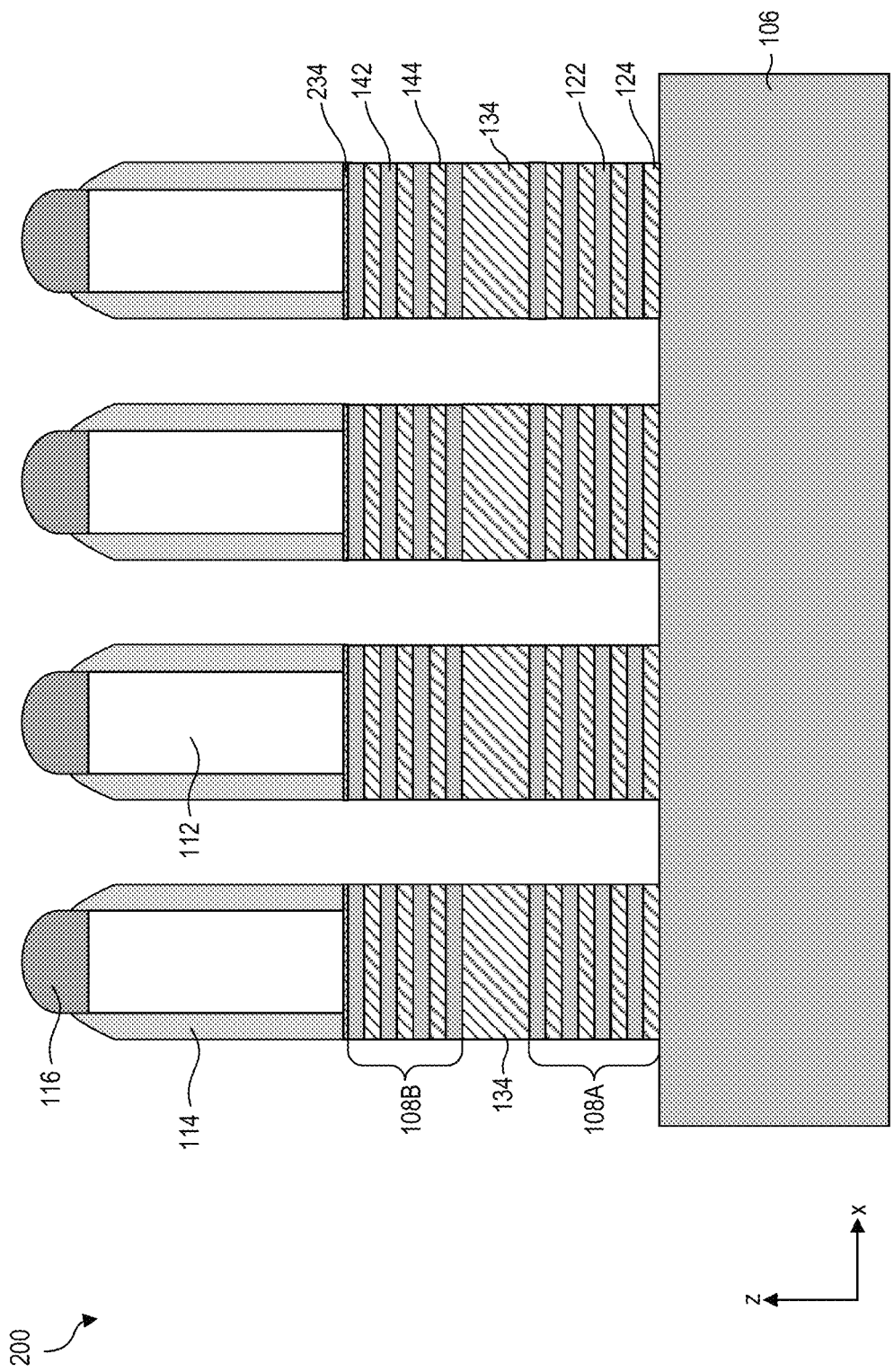

Referring to FIG. 1, in operation 110, sacrificial gate structures are formed on the substrate and the semiconductor layers are etched, according to some embodiments. Referring to FIGS. 3A and 3B, STI regions 138 with first and second protective liners 138A-138B and insulating layer 138C can be formed on substrate 106. FIG. 3B is a cross-sectional view of semiconductor device 200 in FIG. 3A as viewed from the lines of C-C. In some embodiments, hard mask layer 136 is removed prior to the formation of STI regions 138. Forming STI regions 138 can include (i) depositing a layer of nitride material (not shown) for first protective liners 138A on the structure of FIG. 2A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 3A. The layers of nitride and oxide materials can be deposited using a suitable process for depositing oxide and nitride materials, such as ALD and CVD. These layers of oxide and nitride materials can prevent oxidation of the sidewalls of lower layer stack 108A during the deposition and annealing of the insulating material for insulating layer 138C. In some embodiments, the layer of insulating material for insulating layer 138C can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane ($SiH_4$) and oxygen ($O_2$) as reacting precursors. In some embodiments, the layer of insulating material can be formed using a sub-atmospheric CVD (SACVD) process or high aspect-ratio process (HARP), where process gases can include tetraethoxysilane (TEOS) and/or ozone ($O_3$).

Polysilicon gate structures 112 are formed on STI regions 138 and on the stacks of semiconductor layers, as shown in FIGS. 3A and 3B. Polysilicon gate structures 112 are sacrificial gate structures and can be replaced in a gate replacement process to form metal gate structures. In some embodiments, the formation of polysilicon gate structures 112 can include blanket depositing a layer of polysilicon material and etching the layer of polysilicon material through a patterned hard mask layer 116 formed on the layer of polysilicon material. In some embodiments, the layer of polysilicon material can be undoped and hard mask layer 116 can include an oxide layer and/or a nitride layer. The oxide layer can be formed using a thermal oxidation process and the nitride layer can be formed by LPCVD or PECVD deposition processes. Hard mask layer 116 can protect polysilicon gate structures 112 from subsequent processing steps (e.g., during formation of spacers 114, source/drain regions, and/or ILD layers). The blanket deposition of the layer of polysilicon material can include CVD, PVD, ALD, or any other suitable deposition process. In some embodiments, etching of the deposited layer of polysilicon material can include a dry etch, a wet etch, or a combination thereof. Spacers 114 can be formed on sidewalls of polysilicon gate structures 112. Forming spacers 114 can include blanket depositing a layer of an insulating material (e.g., an oxide, a nitride, and/or silicon carbon oxynitride material) followed by photolithography and an etching processes (e.g., reactive ion etching or any other suitable dry etching process using a chlorine- or fluorine-based etchant). In some embodiments, one or more liner layers 234 can be formed on lower layer stack 108A and upper layer stack 108B prior to the formation of polysilicon gate structures 112. Liner layer 234 can be formed using any suitable dielectric material, such as silicon nitride, silicon carbide, silicon oxycarbide, and silicon oxycarbonitride.

Portions of the upper and lower layer stacks not covered and protected by polysilicon gate structures 112 can be etched. The etch process can remove portions of semiconductor layers 122, semiconductor layers 124, and isolation structure 134 that are exposed between adjacent polysilicon gate structures 112. The etch process can include a wet etch process using, for example, diluted hydrofluoric (HF) acid. In some embodiments, one or more etching processes can be used. For example, the etching process can include an etching process for removing silicon material and another etching process for removing silicon germanium material.

During the etching process, polysilicon gate structures 112 can be protected from being etched by spacers 114 and hard mask layer 116.

Figure 4:
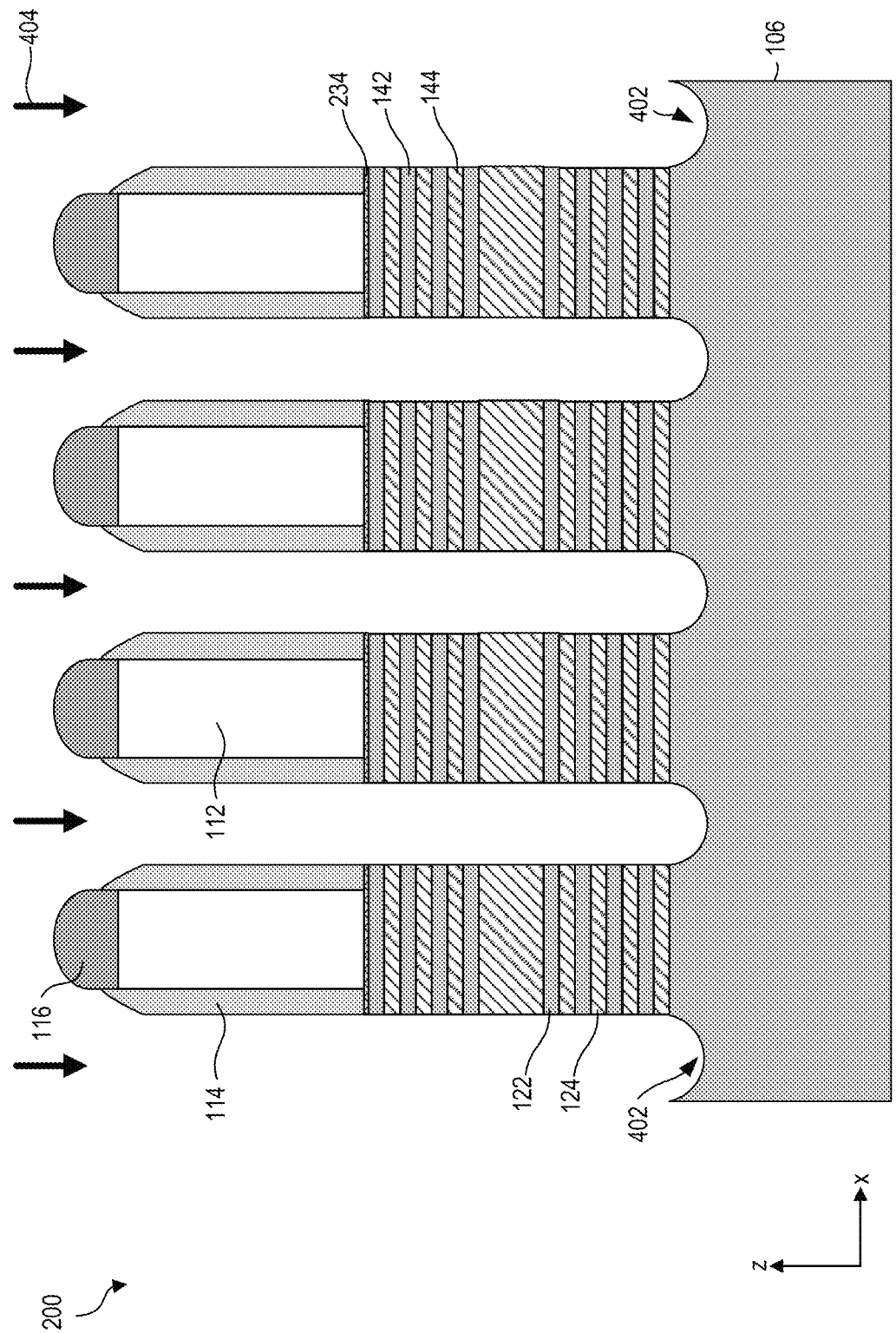

Referring to FIG. 1, in operation 115, recesses can be formed in the substrate between polysilicon gate structures, according to some embodiments. Referring to FIG. 4, recesses 402 (e.g., grooves) can be formed in substrate 106 and between adjacent poly gate structures 112. Recesses 402 can be formed using an anisotropic etching process 404 with an etching rate in the vertical direction (e.g., along the z-axis) substantially greater than an etching rate in the horizontal direction (e.g., along the x-axis). For example, a plasma etching process using fluorine and/or chlorine etchants can be used. In some embodiments, the plasma etching process can use sulfur hexafluoride, carbon tetrafluoride, fluoroform, boron trichloride, hydrogen bromide, any suitable etchants, or combinations thereof. In some embodiments, a voltage bias can be applied to substrate 106 to increase the etching rate in the vertical direction. In some embodiments, recesses 402 can be formed during operation 110 of etching semiconductor layers 122 and semiconductor layers 124. For example, etching semiconductor layers 122 and 124 can include alternating cycles of etching processes, and etching process 404 can use similar plasma species as the plasma etching process for etching semiconductor layers 122. In some embodiments, the formation of recesses between polysilicon gate structures is optional.

Figure 5:
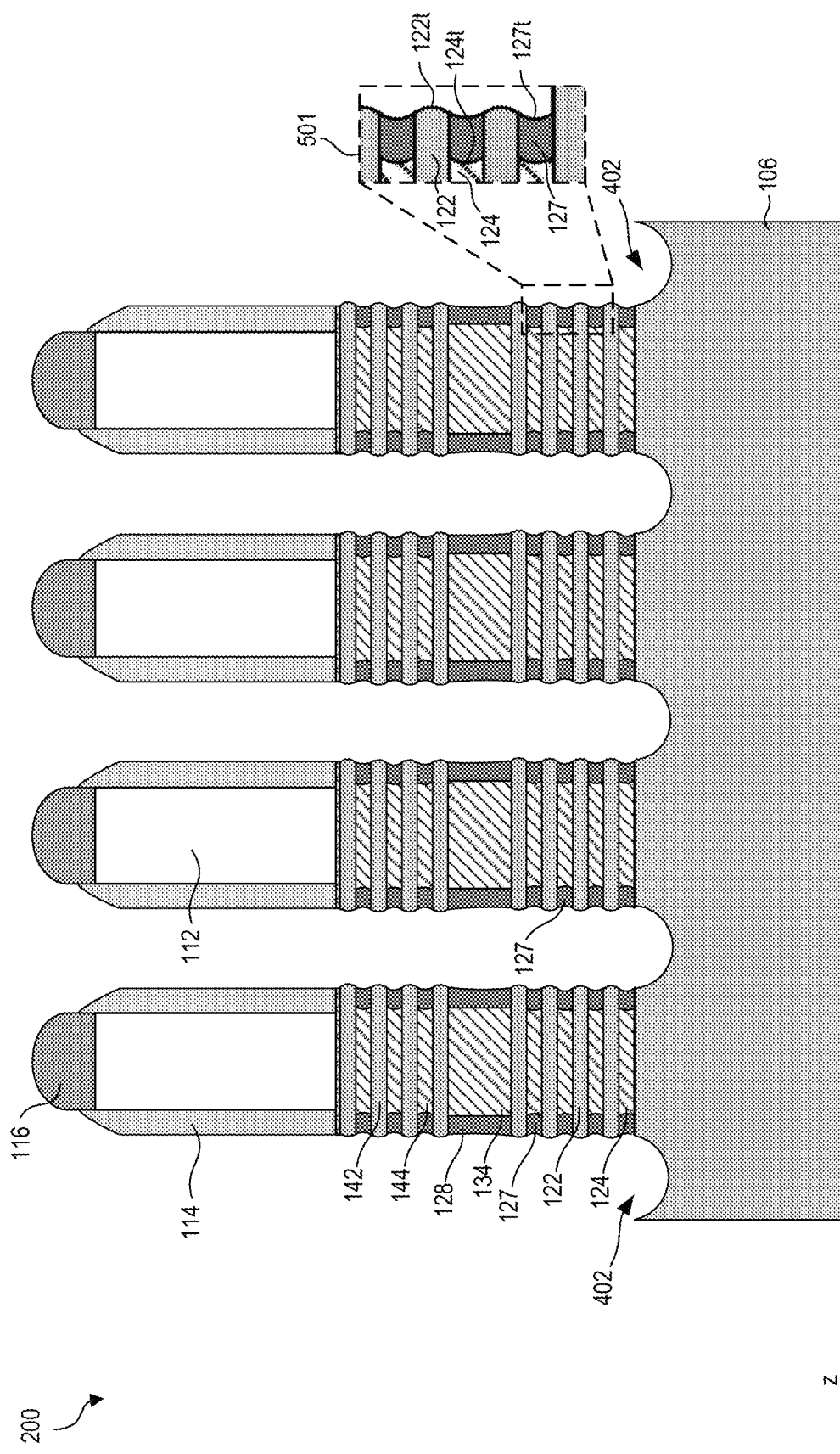

Referring to FIG. 1, in operation 120, spacers are formed between the semiconductor layers, according to some embodiments. Referring to FIG. 5, portions of semiconductor layers 124 and 144 can be etched back to form recessed regions and dielectric material can be deposited in the recessed regions to form spacers 127. In some embodiments, sidewalls of isolation structures 134 can be etched back and dielectric material can also be deposited on the etched-back isolation structures to form spacers 128. In some embodiments, depending on device design, other portions of the semiconductor layers can be etched back. For example, portions of semiconductor layers 122 and semiconductor layers 142 can be etched back such that a dielectric material can be deposited to form spacers. In another example, semiconductor layers 122 of lower layer stack and semiconductor layers 144 of upper layer stack are etched back. In a further example, semiconductor layers 124 of lower layer stack 108A and semiconductor layers 142 of upper layer stack 108B are etched back. The aforementioned examples are not shown in FIG. 5 for simplicity.

Semiconductor layers 124 can be etched back by a dry etching process, a wet etching process, or a combination thereof. In some embodiments, the etch back process of semiconductor layers 124 can be configured to form non-planar outer surfaces of semiconductor layers 122 and 124. As shown in enlarged view 501 of FIG. 5, semiconductor layers 122 can have curved convex outer surfaces 122t and semiconductor layers 124 can have curved concave outer surfaces 124t. In some embodiments, subsequently-formed spacers 127 can also have outer surfaces 127t that substantially contour outer surface 124t of semiconductor layers 124. The non-planar (e.g., curved) outer surfaces of spacers 127 and semiconductor layers 122 can reduce voids in subsequently-formed source/drain structures by removing sharp corners where voids tend to form.

Spacers 127 can be formed on the concave outer surface 124t of semiconductor layers 124 and on top/bottom surfaces of semiconductor layers 122 by a blanket deposition of a dielectric material layer and a horizontal etch of the blanket-deposited dielectric material layer. Spacers 128 can be formed using a material similar to that of spacers 127 and formed on sidewall surfaces of isolation structures 134. Isolation structures 134 can be horizontally etched resulting in a width less than a width of semiconductor layers 122 or 142. Spacers 128 can be formed on the horizontally-etched isolation structure 134. In some embodiments, the blanket deposition process can include a plurality of cycles of deposition and etch processes. Spacers 127 and spacers 128 can include a single layer or a stack of dielectric layers, deposited by ALD, FCVD, or any other suitable deposition process. The etch process in each cycle of the blanket deposition process of dielectric material layer can include a dry etch process using a gas mixture of hydrogen fluoride (HF) and ammonia ($NH_3$). Spacers 127 and 128 can include suitable dielectric material, such as silicon, oxygen, carbon, and nitrogen. The horizontal etch process of the blanket deposited dielectric material layer to form spacers 127 can be performed by a dry etch process using a gas mixture of HF and $NH_3$. Other methods of deposition and horizontal etch processes for forming spacers 127 and 128 can be used.

Figure 6:
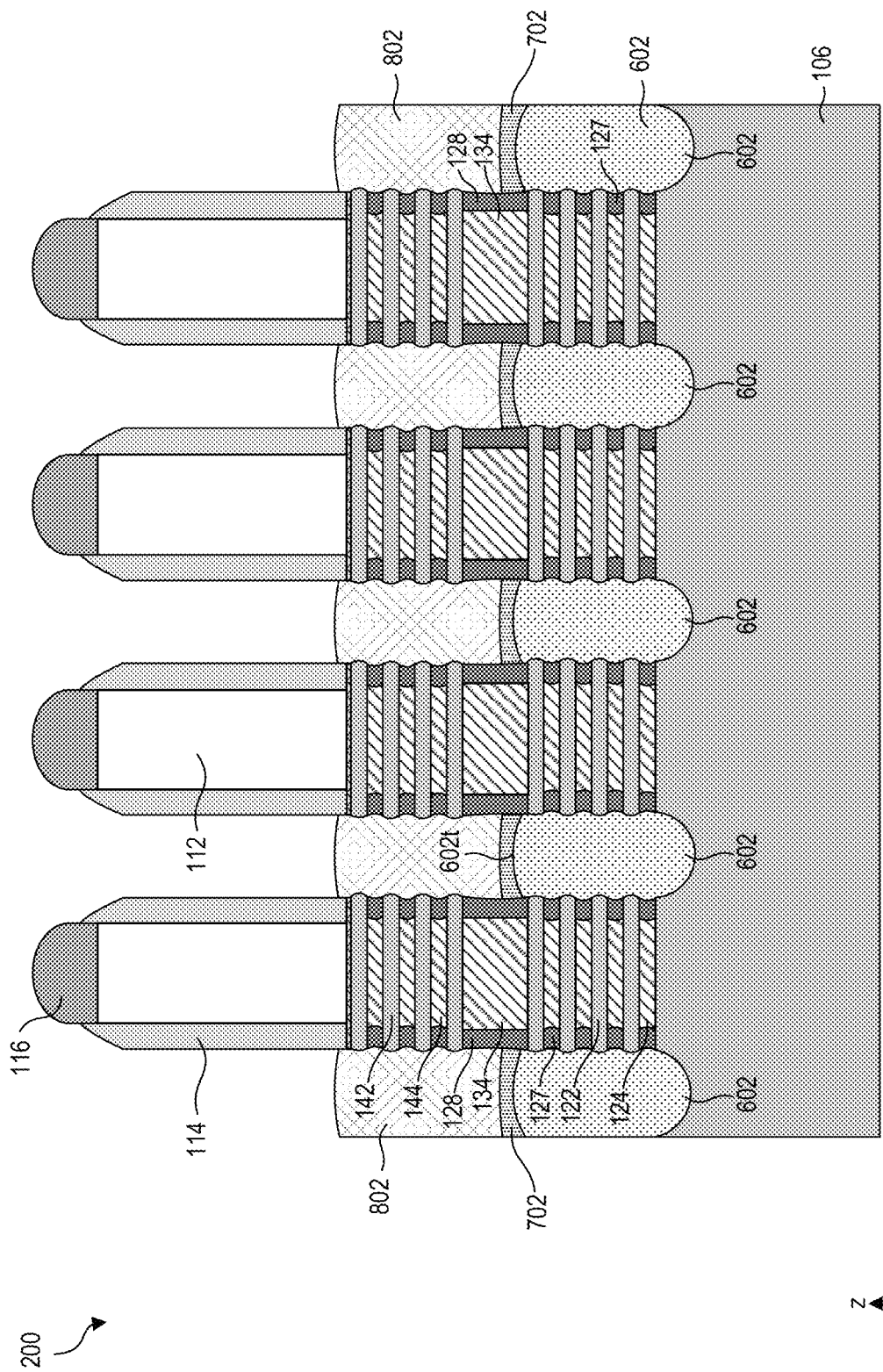

Referring to FIG. 1, in operation 125, epitaxial source/drain structures can be disposed on the exposed surfaces of the substrate, the spacers, and the semiconductor layers, according to some embodiments. Referring to FIG. 6, epitaxial source/drain structures can include lower epitaxial structures 602 and upper epitaxial structures 802. An isolation layer 702 is deposited between upper and lower epitaxial structures 602 and 802 for separating the source/drain structures for the upper and lower level semiconductor devices. Lower epitaxial structures 602 can be deposited in recesses 402 illustrated in FIG. 5 as well as on outer surfaces of semiconductor layers 122 and spacers 127. In some embodiments, the deposition process of lower epitaxial structures 602 can continue until lower epitaxial structures 602 contact spacers 128. In some embodiments, upper surfaces of lower epitaxial structures 602 can be between upper and lower surfaces of isolation structures 134. For example, upper surfaces 602t of lower epitaxial structures 602 are below the upper surfaces of isolation structures 134 and above the lower surfaces of isolation structures 134. In some embodiments, the upper surfaces 602t of lower epitaxial structures 602 can include a non-planar surface. For example, the upper surfaces 602t can include a convex surface. In some embodiments, semiconductor device 200 is configured to have n-type devices stacked on p-type devices. For example, semiconductor device 200 can include n-type devices stacked over p-type devices. In some embodiments, lower epitaxial structures 602 illustrated in FIG. 6 can be used for forming the source/drain regions for p-type devices. In some embodiments, lower epitaxial structures 602 can be formed by silicon, silicon germanium, silicon germanium doped with boron, germanium, indium antimonide, gallium antimonide, indium gallium antimonide, or any suitable epitaxial material. In some embodiments, a height of lower epitaxial structures 602 can be between about 2 nm and about 35 nm, between about 3 nm and about 30 nm, or any suitable height values.

In some embodiments, one or more pre-deposition processes can be performed to prepare the exposed surfaces for the epitaxial growth process. For example, the pre-deposition process can be a dry etching process that includes a SICONI process that includes ammonia ($NH_3$) and nitrogen trifluoride ($NF_3$) plasma, an anneal process, or any suitable pre-deposition treatment processes. In some embodiments, the deposition process of lower level epitaxial structures can include a plasma deposition process using suitable precursors, such as hydrogen, nitrogen, silane, dichlorosilane (DCS), diborane ($B_2H_6$), hydrogen chloride (HCl), any suitable precursors, and combinations thereof. In some embodiments, lower epitaxial structures 602 can be formed by epitaxially growing a crystalline material using exposed portions of substrate 106 and semiconductor layers 122 as seed layers. Lower epitaxial structures 602 can be deposited using suitable deposition methods, such as (i) chemical vapor deposition (CVD), including but not limited to, plasma-enhanced CVD (PECVD), low-pressure CVD (LPCVD), atomic layer CVD (ALCVD), ultrahigh-vacuum CVD (UHVCVD), reduced-pressure CVD (RPCVD), and any other suitable CVD; (ii) molecular beam epitaxy (MBE) processes; (iii) any suitable epitaxial process; and (iv) a combination thereof. In some embodiments, lower epitaxial structure 602 can be grown by an epitaxial deposition/partial etch process, which repeats the epitaxial deposition/partial etch process at least once. Such repeated deposition/partial etch process is also called a cyclic deposition-etch (CDE) process. In some embodiments, a plasma deposition process using species, such as germane, dichlorosilane, and hydrochloride, can be used to deposit lower epitaxial structures 602 formed of silicon germanium. In some embodiments, a plasma deposition process using phosphane can be used to deposit first epitaxial layer formed of silicon phosphide.

Isolation layer 702 can be deposited on lower epitaxial structures 602. Isolation layer 702 can be formed by a blanket deposition process followed by an etch back process such that the deposited material only remains at the bottom of the openings between adjacent gate structures. In some embodiments, isolation layer 702 can be formed of any suitable isolation material, such as silicon oxide, silicon nitride, silicon oxynitride, silicon carbide, and combinations thereof. In some embodiments, isolation layer 702 can have a thickness that is between about 15 nm and about 120 nm, between about 20 nm and about 110 nm, between about 25 nm and about 100 nm, or any suitable dimensions.

Upper epitaxial structures 802 can be formed between opposing stacks of semiconductor layers 142 and 144 and on isolation layer 702. In some embodiments, upper epitaxial structures 802 can be used as the source/drain terminals for upper level semiconductor devices, such as n-type GAAFETs. For example, upper epitaxial structures 802 can be formed using silicon phosphide, silicon arsenide, silicon carbide, silicon phosphide carbide, indium phosphide, gallium arsenide, aluminum arsenide, indium arsenide, indium aluminum arsenide, indium gallium arsenide, or any suitable material. In some embodiments, one or more pre-deposition processes can be performed to prepare the exposed surfaces for the epitaxial growth process. For example, the pre-deposition process can be a dry etching process that includes ammonia ($NH_3$) and nitrogen trifluoride ($NF_3$) plasma (e.g., a SICONI process), an anneal process, or any suitable pre-deposition treatment processes. In some embodiments, the deposition process of upper epitaxial structures 802 can include a plasma deposition process using suitable precursors, such as hydrogen, nitrogen, dichlorosilane (DCS), phosphane ($PH_3$), arsine ($AsH_3$), hydrogen chloride (HCl), any suitable precursors, and combinations thereof. Upper epitaxial structures 802 can be deposited using suitable deposition methods, such as (i) CVD, including but not limited to, PECVD, LPCVD, ALCVD, UHVCVD, RPCVD, and any other suitable CVD processes; (ii) MBE processes; (iii) any suitable epitaxial process; and (iv) a combination thereof. In some embodiments, upper epitaxial structure 802 can be grown by an epitaxial deposition/partial etch process.

Figure 7:
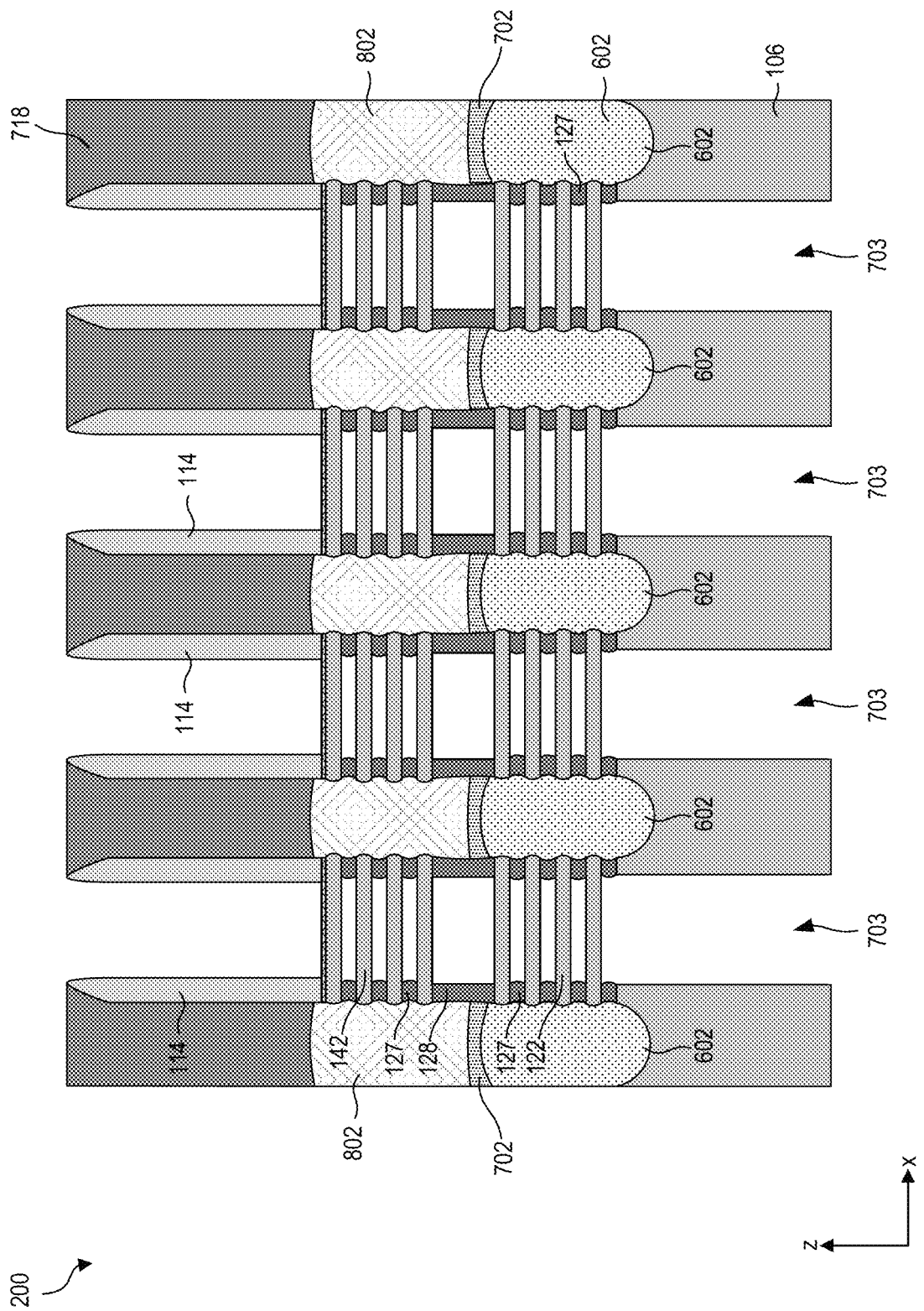

Referring to FIG. 1, in operation 130, an interlayer dielectric (ILD) layer is deposited and nanostructures are formed, according to some embodiments. Referring to FIG. 7, ILD layer 718 is deposited between spacers 114. Hard mask layer 116 and polysilicon gate structures 112 can be removed to expose underlying semiconductor layers 122, 124, 142, and 144. One or more etching processes can be subsequently used to remove one or more of the semiconductor layers such as semiconductor layers 124 and 144. The same etching process can also be used to remove isolation structure 134.

ILD layer 718 can be disposed on top surfaces of upper epitaxial structures 802 and on sidewalls of spacers 114. ILD layer 718 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, the flowable silicon oxide can be deposited using flowable CVD (FCVD). In some embodiments, the dielectric material is silicon oxide. Other materials and formation methods for ILD layer 718 are within the scope and spirit of this disclosure.

The formation of ILD layer 718 can be followed by removing polysilicon gate structures 112, semiconductor layers 124, and semiconductor layers 144 using a dry etching process (e.g., reaction ion etching) or a wet etching process, exposing portions of the upper or lower surfaces of semiconductor layers 122. Semiconductor layers 124 and 144 can be referred to as sacrificial layers whereas semiconductor layers 122 and 142 can be referred to as channel layers. Openings 703 can be formed through backside surface of substrate 106 through suitable patterning and etching processes. The exposed semiconductor layers 122 and 142 can be referred to as nanostructures (e.g., nanowires or nanosheets). The nanostructures formed by semiconductor layers 122 and 142 can be used as channels for subsequently-formed lower and upper semiconductor devices, respectively. Alternatively, not shown in FIG. 7, semiconductor layers 122 and 142 can be removed to expose portions of semiconductor layers 124 and 144, which can also be referred to as nanostructures. Under such device configuration, semiconductor layers 122 and 142 can be referred to as sacrificial layers whereas semiconductor layers 124 and 144 can be referred to as channel layers. In some embodiments, semiconductor layers 122 and semiconductor layers 144 are removed such that portions of semiconductor layers 124 and semiconductor layers 142 form the channel regions of lower and upper level semiconductor devices. In some embodiments, not shown in FIG. 7, semiconductor layers 124 and semiconductor layers 142 can be removed such that portions of semiconductor layers 122 and semiconductor layers 144 form the channel regions. In some embodiments, semiconductor layers 124, semiconductor layers 144, and isolation structures 134 can be formed using similar materials (e.g., silicon germanium) and can be removed using a similar dry etching or wet etching process. For example, the gas etchants used in the dry etching process can include chlorine, fluorine, bromine, or a combination thereof.

Figure 8:
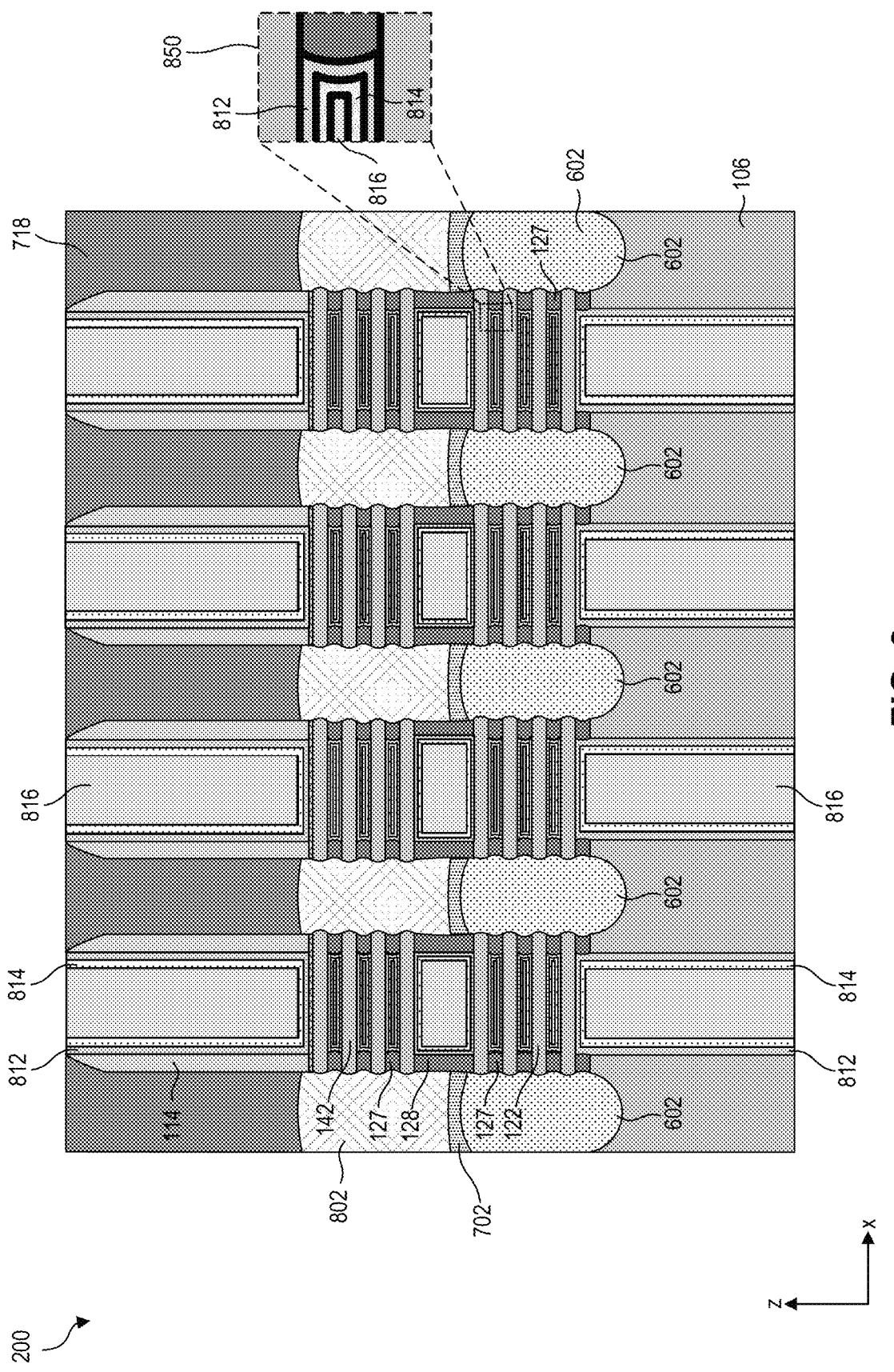

Referring to FIG. 1, in operation 135, an initial gate structure is formed in the upper and lower semiconductor device regions, according to some embodiments. As shown in FIG. 8, initial gate structure including gate dielectric layers 812, gate work function layers 814, and gate electrodes 816 can be formed in areas left vacant by the removed semiconductor layers 124, semiconductor layers 144, polysilicon gate structures 112, and isolation structures 134. Initial gate structures can wrap around on exposed nanowire-shaped semiconductor layers 122 and 142.

Forming gate dielectric layers 812 can include a blanket deposition process of a suitable gate dielectric material layer. In some embodiments, gate dielectric layers 812 can be formed of a high-k dielectric material (e.g., dielectric material having dielectric constant greater than about 3.9). For example, gate dielectric layers 812 can be formed of hafnium oxide. Work function layers 814 are formed on gate dielectric layers 812. In some embodiments, each work function layer 814 can include one or more work function layers and formed using the same or different material and/or thickness. Gate dielectric layers 812 and gate work function layers 814 can each wrap around nanowire-shaped semiconductor layers 122 and 142. Depending on the spaces between adjacent semiconductor layers 122 and 142, semiconductor layers 122 and 142 can be wrapped around by gate dielectric layer 812 and work function layers 814, filling the spaces between adjacent semiconductor layers 122 and 142. In some embodiments, a subsequently-formed gate electrode material can also be formed in the spaces between adjacent semiconductor layers 122 and 142, as described below.

Gate electrodes 816 can be formed on the work function layers, according to some embodiments. Layers of conductive material for gate electrodes 816 are formed on work function layers 814. As shown in enlarged view 850, if separations between adjacent semiconductor layers 122 are sufficient to accommodate the thickness of the gate electrode material, gate electrodes 816 can be formed between adjacent semiconductor layers 122 and on work function layers 814 such that the spaces between adjacent semiconductor layers 122 are filled. Gate electrodes 816 between adjacent semiconductor layers 122 and gate electrodes 816 formed in substrate 106 are electrically coupled to each other. Openings can be formed from the back surface of substrate 106 to expose semiconductor layers 122 and gate electrodes 816 can be formed between adjacent semiconductor layers 122 by depositing a conductive material, such as a suitable metal material. The layer of conductive material for gate electrodes 816 can include suitable conductive materials, such as titanium, silver, aluminum, tungsten, copper, ruthenium, molybdenum, tungsten nitride, cobalt, nickel, titanium carbide, titanium aluminum carbide, manganese, zirconium, metal alloys, and combinations thereof. Gate electrodes 816 can be formed by ALD, PVD, CVD, or any other suitable deposition process. The deposition of gate electrodes 816 can continue until openings between opposing spacers 114 are filled with gate electrodes 816. A CMP process can remove excessive gate electrodes 816 such that top surfaces of gate electrodes 816 and ILD layer 718 are substantially coplanar. Similarly, the deposition of gate electrodes 816 in openings 703 can continue until openings in substrate 106 are filled with gate electrodes 816. Another CMP process can be performed on the back surface of substrate 106 such that surfaces of gate electrodes 816, substrate 106, gate dielectric layer 812, and work function layers 814 are substantially coplanar. In some embodiments, other structures can be formed, such as blocking layers. One or more blocking layers (not shown in FIG. 8) can be formed prior to depositing gate electrodes 816 to prevent diffusion and oxidation of gate electrode materials.

Figure 9:
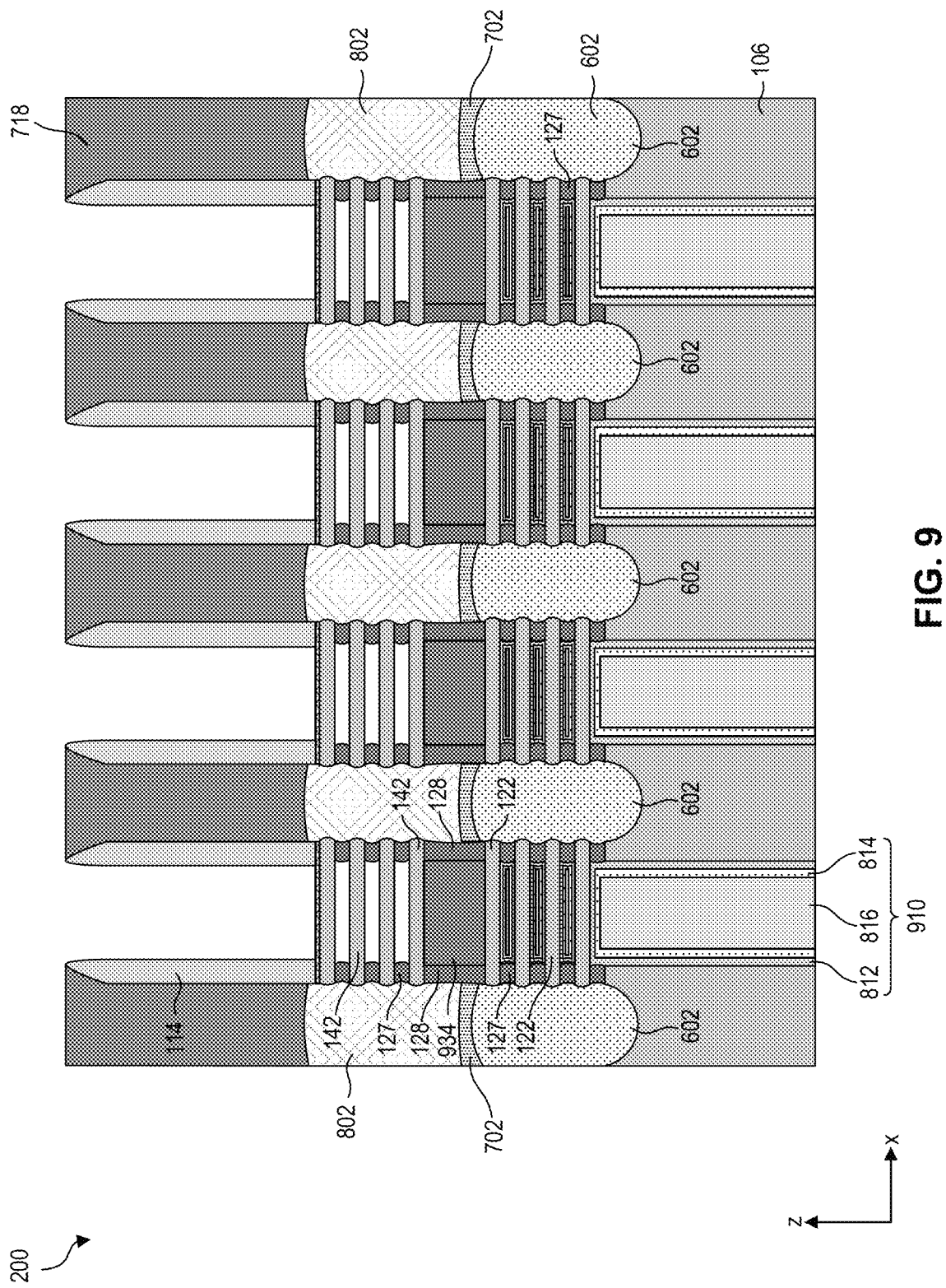

Referring to FIG. 1, in operation 140, the initial gate structure is etched backed to form lower level gate structures and a gate isolation material is deposited, according to some embodiments. Referring to FIG. 9, initial gate structures formed between spacers 114, semiconductor layers 142, and spacers 128 are removed using suitable etching processes. In some embodiments, portions of initial gate structure formed in substrate 106 and also in between spacers 127 and semiconductor layers 122 can be protected by a masking layer (not illustrated in FIG. 8) during the etching processes and remain intact. The etching processes can include multi-step etching processes suitable for etching gate electrode 816, work function layer 814, and gate dielectric layer 812. The etching processes can include wet etching processes using suitable etchants, such as a mixture of water, hydrogen peroxide, and ammonium hydroxide. The etching processes can be timed processes that proceed until semiconductor layers 142 are exposed. The remaining portions of the initial gate structure can form lower gate structure 910 as the gate structure of the subsequently-formed lower level semiconductor devices.

Gate isolation structure 934 can be formed between opposing spacers 128 and also between semiconductor layer 122 and semiconductor layer 142. Gate isolation structure 934 can be formed by a blanket deposition process followed by an etch back process. For example, a gate isolation material can be blanket deposited between spacers 114, between semiconductor layers 142, and between spacers 128. The gate isolation material can be etched back to remove portions of the gate isolation material formed between spacers 114 and between semiconductor layers 142 such that gate isolation material remains between spacers 128 to form gate isolation structures 934. In some embodiments, gate isolation structure 934 can be formed of a suitable dielectric material, such as silicon germanium and a compound formed of silicon, germanium, and tin. The etching back process can be a plasma dry etching process or a wet etching process. For example, the plasma dry etching process for removing silicon germanium material can use plasma species, such as oxygen and sulfur hexafluoride.

Figure 10:
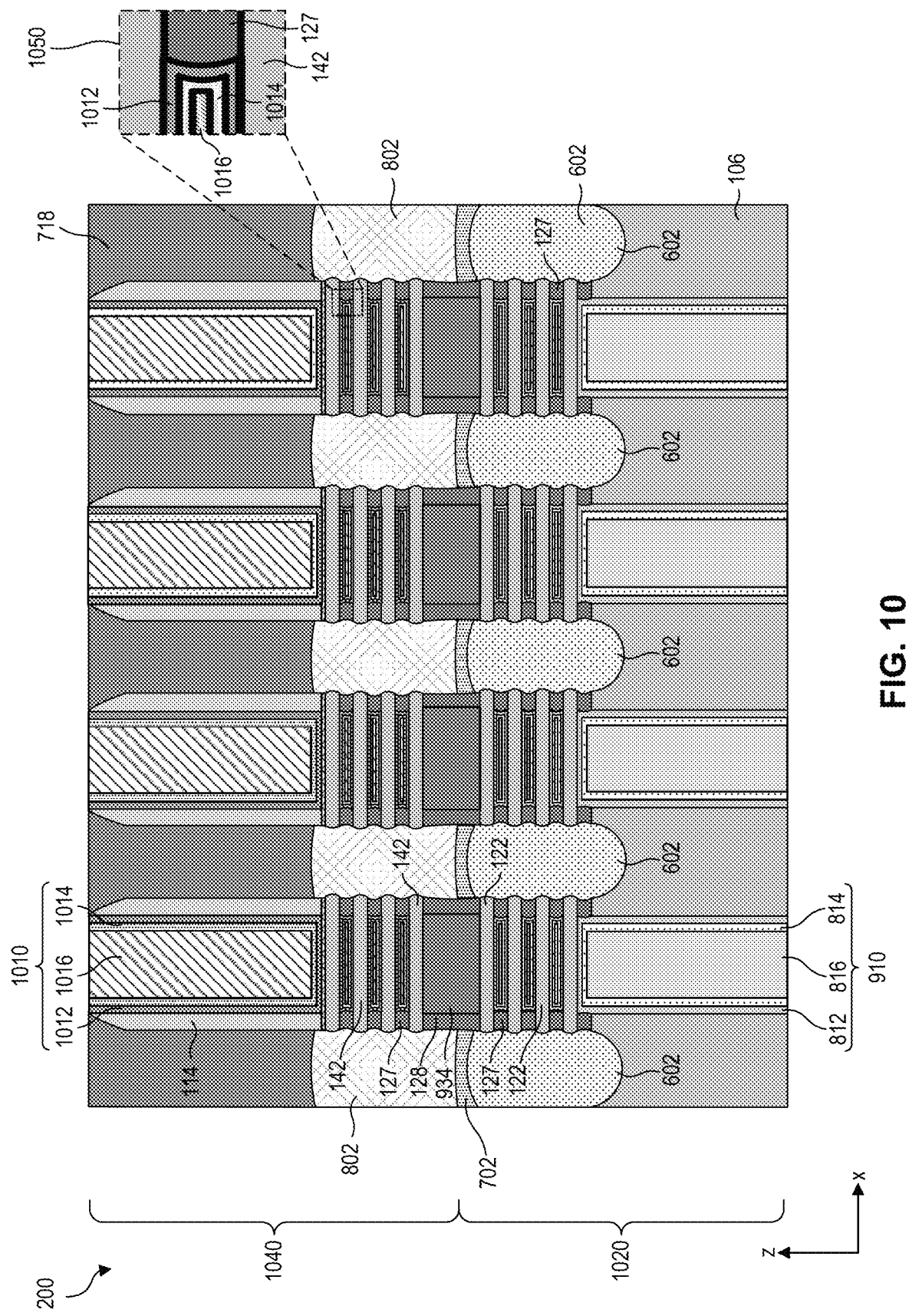

Referring to FIG. 1, in operation 145, upper level gate structures are formed, according to some embodiments. Referring to FIG. 10, upper level gate structures are formed between spacers 114 and semiconductor layers 142. In some embodiments, upper level gate structures 1010 can include gate dielectric layers 1012, work function layers 1014, and gate electrodes 1016 that can be similar to gate dielectric layers 812, work function layers 814, and gate electrodes 816, respectively. For example, gate dielectric layers 812 and 1012 can be formed using hafnium oxide. In some embodiments, the materials used in lower and upper level gate structures can be different. For example, work function layer 814 can be formed using titanium aluminum alloy or titanium aluminum nitride alloy and work function layer 1014 can be formed using titanium nitride, titanium silicon nitride, or tantalum nitride.

The deposition process for upper level gate structures 1010 can be similar to those of lower level gate structures 910. For example, forming gate dielectric layers 1012 can include a blanket deposition process of a high-k dielectric material layer using suitable deposition processes, such as ALD or CVD. Work function layers 1014 are formed on gate dielectric layers 1012. In some embodiments, each work function layer 1014 can include one or more work function layers and formed using the same or different material and/or thickness. Gate dielectric layers 1012 and gate work function layers 1014 can each wrap around nanowire-shaped semiconductor layers 142. Depending on the spaces between adjacent semiconductor layers 142, semiconductor layers 142 can be wrapped around by gate dielectric layer 1012 and work function layers 1014, filling the spaces between adjacent semiconductor layers 142. In some embodiments, a subsequently-formed gate electrode material can also be formed in the spaces between adjacent semiconductor layers 142. For example, gate electrodes 1016 can be formed on work function layers 1014. As shown in enlarged view 1050, if separations between adjacent semiconductor layers 142 are sufficient to accommodate the thickness of the gate electrode material, gate electrodes 1016 can be formed between adjacent semiconductor layers 142 and on work function layers 1014 such that the spaces between adjacent semiconductor layers 142 are filled. Gate electrodes 1016 between adjacent semiconductor layers 142 and gate electrodes 1016 between spacers 114 are electrically coupled to each other. Gate electrodes 1016 can be formed between adjacent spacers 114 by depositing a conductive material, such as a suitable metal material. The conductive materials for gate electrodes 1016 and deposition methods for forming the same can be similar to those of gate electrode 816 and are not described herein for simplicity. The deposition of gate electrodes 1016 can continue until openings between opposing spacers 114 are filled with gate electrode material. A CMP process can remove excessive gate electrode material such that top surfaces of gate electrodes 1016 and ILD layer 718 are substantially coplanar. One or more blocking layers (not shown in FIG. 10) can be formed prior to depositing gate electrodes 1016 to prevent diffusion and oxidation of gate electrode materials.

Lower level semiconductor devices 1020 and upper level semiconductor devices 1040 can be formed after the formation of the metal gates. In some embodiments, lower level semiconductor devices 1020 can be p-type FET (PFET) devices including nanostructures, such as nanowires and nanosheets. In some embodiments, lower level semiconductor devices 1020 can include nanowires formed by semiconductor layers 122. Upper level semiconductor devices 1040 can be n-type FET (NFET) devices including nanowires formed by semiconductor layers 142. In some embodiments, upper level semiconductor devices 1040 can be PFET devices and lower level semiconductor devices 1020 can be NFET devices.

Figure 11:
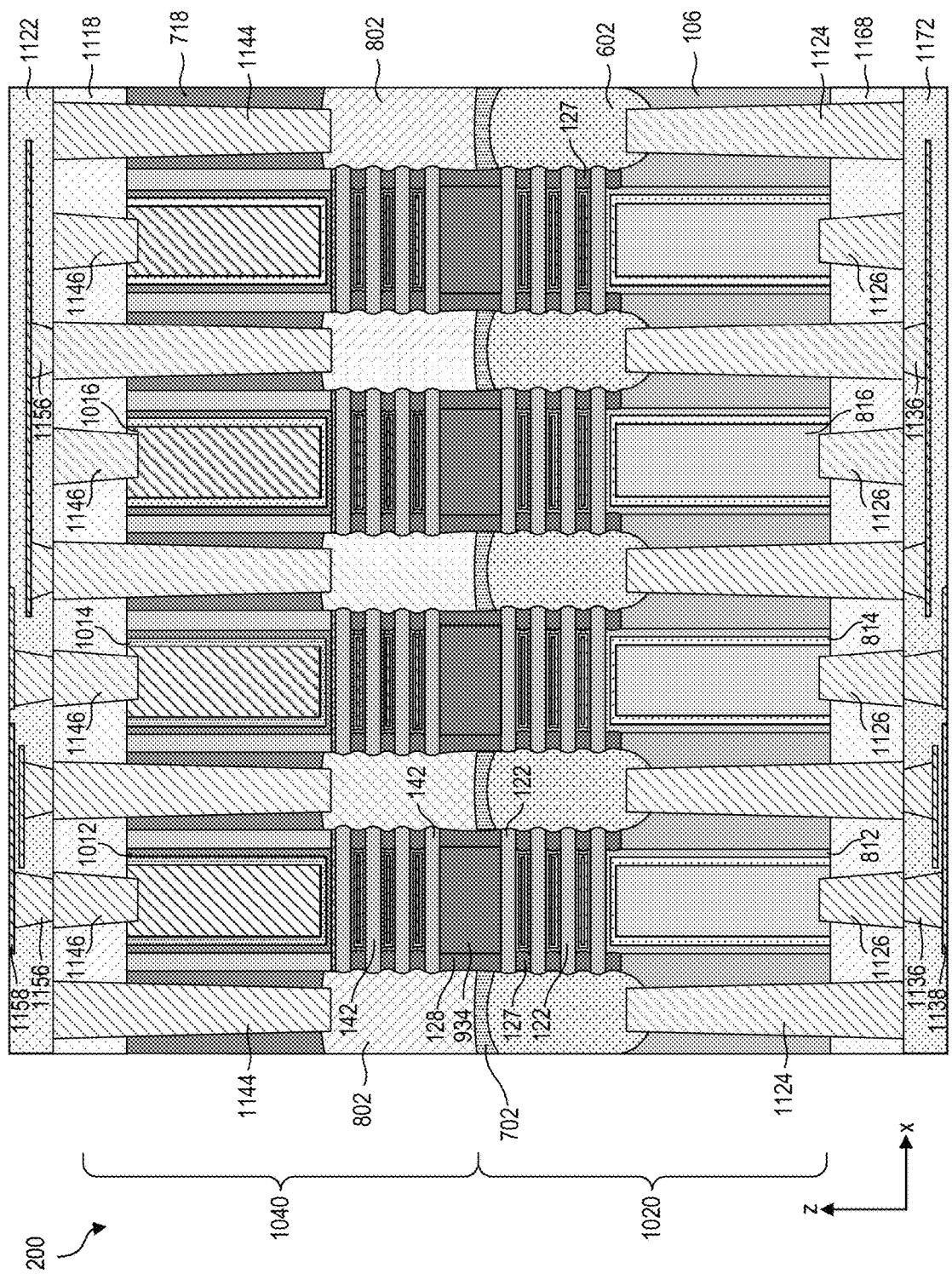

Referring to FIG. 1, in operation 150, source/drain contacts and gate contacts are formed, according to some embodiments. Referring to FIG. 11, source/drain contacts 1144 and gate contacts 1146 are formed to provide electrical connections to the source/drain regions and the gate electrodes of the upper level semiconductor devices 1040, respectively. For example, source/drain contacts 1144 and gate contacts 1146 can be used to transmit electrical signals between source/drain regions and gate electrodes and external terminals (not shown in FIG. 11). For example, gate contacts 1146 can be electrically coupled to gate electrodes 816 formed between spacers 114 and between adjacent semiconductor layers 122. Additional ILD layers can be formed on the top surface of ILD layer 718. For example, dielectric layer 1118 can be formed on ILD layer 718. In some embodiments, dielectric layer 1118 can be formed using a similar material as ILD layer 718. Gate contacts 1146 and source/drain contacts 1144 can be formed by forming openings in dielectric layer 1118 and ILD layer 718 and depositing a conductive material in the openings. Silicide layers (not shown in FIG. 11) can be formed between source/drain contacts 1144 and upper epitaxial structures 802. For example, the deposition process of forming source/drain contact can include depositing a metal layer within the openings and performing an anneal process to induce silicidation of the deposited metal layer. The conductive materials for forming source/drain contacts 1144 and gate contacts 1146 can include titanium, aluminum, silver, tungsten, cobalt, copper, ruthenium, zirconium, nickel, titanium nitride, tungsten nitride, metal alloys, or combinations thereof. The deposition process can include ALD, PVD, CVD, any suitable deposition processes, or combinations thereof.

Source/drain contacts and gate contacts can also be formed for electrically coupling to the terminals of lower level semiconductor devices 1020. For example, source/drain contacts 1124 and gate contacts 1126 can be formed for providing electrical connections to lower level epitaxial structures 602 and gate electrodes 816. Gate contacts 1126 can be electrically coupled to gate electrodes 816, and source/drain contacts 1124 can be electrically coupled to lower level epitaxial structures 602. Semiconductor device 200 can be flipped over for the formation of source/drain contacts 1124 and gate contacts 1126. Additional dielectric layers can be formed on the bottom surface of substrate 106 before the contacts are formed. For example, dielectric layer 1168 can be formed on substrate 106. In some embodiments, dielectric layer 1168 can be formed using similar material as dielectric layer 1118. Gate contacts 1126 can be formed by forming openings in dielectric layer 1168 using one or more etching processes and depositing a conductive material in the openings. In some embodiments, gate electrodes 1016 can also be etched during the formation of the openings. Source/drain contacts 1124 can be formed by etching dielectric layer 1168 and substrate 106 to form openings and depositing a conductive material in the openings. Silicide layers can be formed between source/drain contacts 1124 and lower epitaxial structures 602 and are not shown for simplicity. The conductive materials and the deposition processes for forming source/drain contacts 1124 and gate contacts 1126 can be similar to those for forming source/drain contacts 1144 and gate contacts 1146.

A planarization process can planarize the exposed surfaces of dielectric layer 1168, source/drain contacts 1124, and gate contacts 1126 such that the exposed surfaces are substantially coplanar. In some embodiments, gate contacts 1126 can extend into gate electrodes 816 and source/drain contacts 1124 can extend into lower epitaxial structures 602.

Alternatively, source/drain contacts and gate contacts for both lower level semiconductor devices 1020 and upper level semiconductor devices 1040 can be formed on the front side of semiconductor device 200 (e.g., through ILD layer 718). For example, a first source/drain contact can be formed through ILD layer 718 for electrically coupling to upper epitaxial structures 802. A second source/drain contact can be formed through a different portion of ILD layer 718 for electrically coupling to lower epitaxial structures 602. The first and second portions of ILD layer 718 are laterally separated (e.g., with a lateral offset). Similarly, gate contacts for lower level semiconductor devices 1020 and upper level semiconductor devices 1040 can be formed through ILD layer 718. Source/drain contacts and gate contacts formed at the front side of semiconductor devices 200 are not illustrated in FIG. 11 for simplicity.

Back-end-of-line (BEOL) interconnect structures are formed over the source/drain contacts and the gate contacts on the front and back sides of semiconductor device 200. Additional dielectric layers 1122 and 1172 can be deposited on dielectric layers 1118 and 1168, respectively. BEOL interconnect structures can be formed in dielectric layers 1122 and 1172. In some embodiments, the interconnects can be a network of electrical connections that include vias 1136 and 1156 extending vertically (e.g., along the z-axis) and wires 1158 and 1138 extending laterally (e.g., along the x-axis). Interconnect structures can provide electrical connections to source/drain contacts 1144 and 1124 as well as and gate contacts 1146 and 1126. In some embodiments, suitable passive and active semiconductor devices can be formed in dielectric layers 1118, 1122, 1168, and 1172 and are not illustrated for simplicity.

FIGS. 12-16 illustrate semiconductor structure 1200 having various stacked semiconductor devices, according to some embodiments. The stacked semiconductor devices illustrated in FIGS. 12-16 can be formed using fabrication methods described in FIG. 1 and with a selective nanostructure release process. Different from the nanostructure releasing process described in FIG. 7 where nanostructures for lower and higher level semiconductor devices are simultaneously released (e.g., exposed by removing covering material), nanostructures for upper and lower level semiconductor devices in FIGS. 12-16 are released using different etching processes. Using sacrificial semiconductor layers having different etching selectivity can increase yield and reliability during the nanostructure release process. Reference numerals in FIGS. 12-16 generally indicate identical, functionally similar, and/or structurally similar elements.

Figure 12:
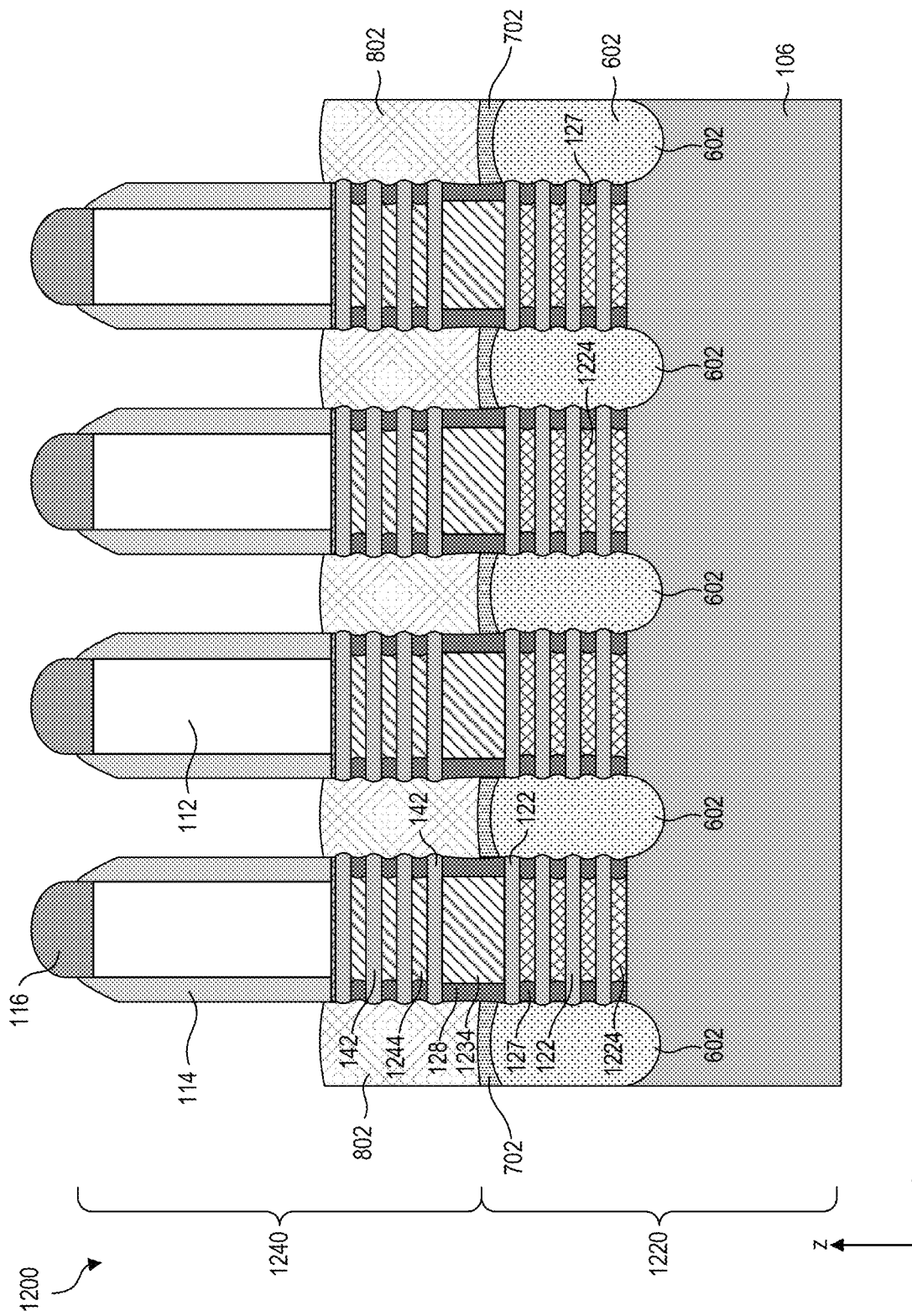
FIGS. 12-21 illustrate various stacked semiconductor devices at various stages of their fabrication processes, in accordance with some embodiments.

FIG. 12 illustrates lower level semiconductor devices and upper level semiconductor devices after formation of semiconductor layers and epitaxial source/drain structures, according to some embodiments. Semiconductor structure 1200 includes lower level semiconductor devices 1220 and upper level semiconductor devices 1240. Isolation structure 1234 can be formed between semiconductor layers 122 and 142. Semiconductor layers for lower level semiconductor devices 1220 can be formed using alternatingly-stacked semiconductor layers 1224 and semiconductor layers 122. Semiconductor layers for upper level semiconductor devices 1240 can be formed using alternatingly-stacked semiconductor layers 1244 and semiconductor layers 142. The deposition processes of semiconductor layers 1224, semiconductor layers 1244, and isolation structures 1234 can be similar to semiconductor layers 124, semiconductor layers 144, and isolation structures 134 described in FIGS. 2A-2C and are not described in detail herein for simplicity.

In some embodiments, semiconductor layers 1244 and isolation structure 1234 can be formed using a similar material whereas semiconductor layers 1224 can be formed using a different material to achieve etch selectivity. For example, semiconductor layers 1244 and isolation structure 1234 can be formed with low germanium atomic concentration whereas semiconductor layers 1224 can be formed with high germanium atomic concentration. In some embodiments, semiconductor layers 1244 and isolation structure 1234 can be formed using silicon germanium material with a germanium atomic concentration between about 10% and about 30%, between about 15% and about 25%, or any suitable germanium atomic concentration. In some embodiments, semiconductor layers 1224 can be formed using silicon germanium with a germanium atomic concentration greater than those of semiconductor layers 1244 and isolation structure 1234, such as having a germanium atomic concentration greater than about 35%. In some embodiments, semiconductor layers 1224 can be formed using germanium (e.g., germanium atomic concentration of about 100%).

In another example, semiconductor layers 1244 and isolation structure 1234 can be formed using silicon carbide or a compound including silicon, germanium, and tin, whereas semiconductor layers 1224 can be formed using silicon germanium. In some embodiments, semiconductor layers 1224 can have a germanium atomic concentration between about 10% and about 30%, between about 15% and about 25%, or any suitable germanium atomic concentrations.

The above examples illustrate different material compositions for providing high etching selectivity (e.g., greater than about 10) such that semiconductor layers 1244 and isolation structure 1234 can remain intact while semiconductor layers 1224 are removed using suitable etching processes, as described below with reference to FIG. 13.

Figure 13:
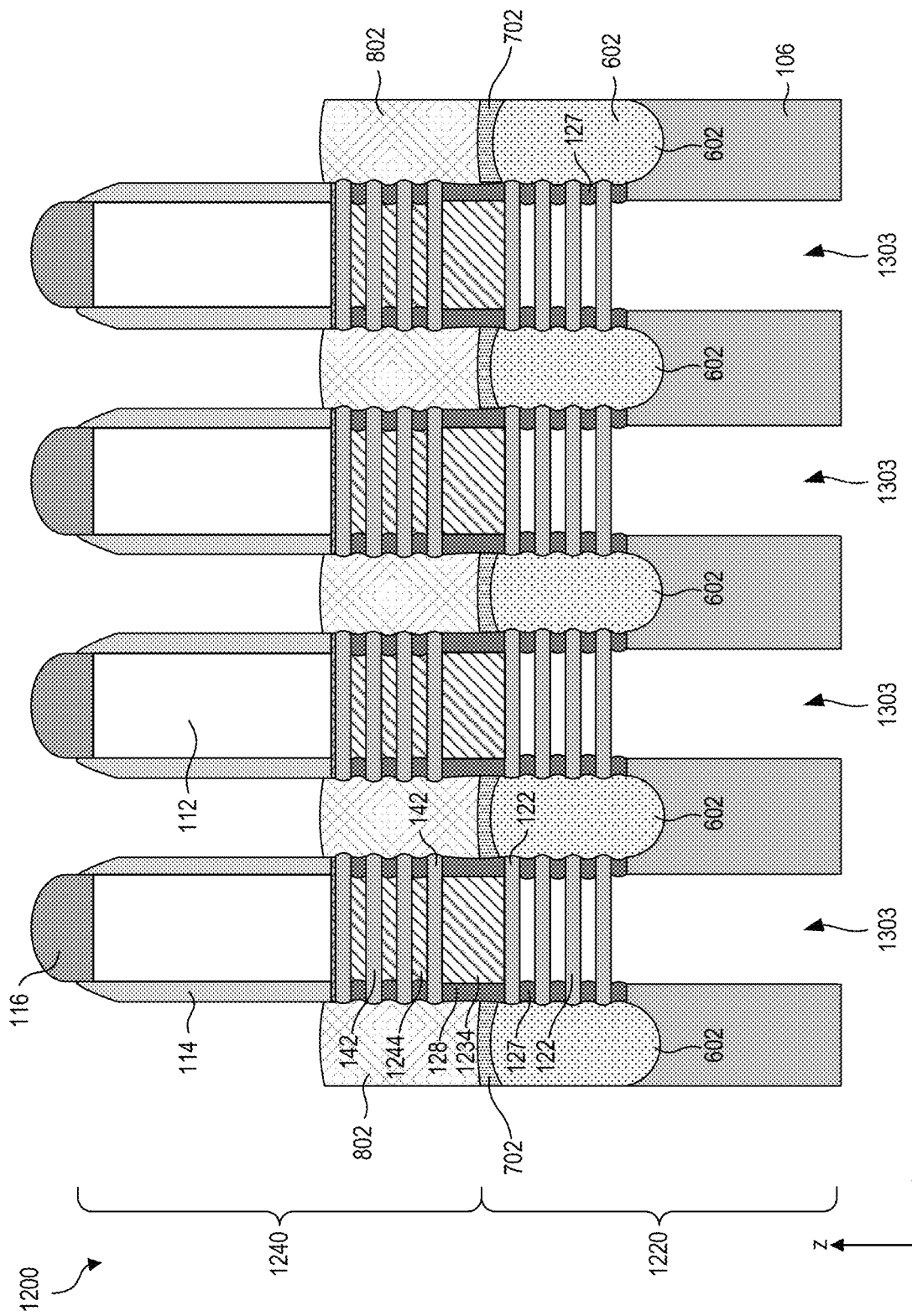

FIG. 13 illustrates semiconductor structure 1200 after nanostructures for lower level semiconductor devices 1220 are formed, according to some embodiments. Openings 1303 can be formed through substrate 106 and etching processes can be performed to remove semiconductor layers 1224. In some embodiments, the etching process can include a plasma etching process or a wet chemical etching process. For example, the gas etchants used in the dry etching process can include chlorine, fluorine, bromine, or a combination thereof. The nanostructures formed by exposing semiconductor layers 122 can be used as channels for lower semiconductor devices 1220.

Figure 14:
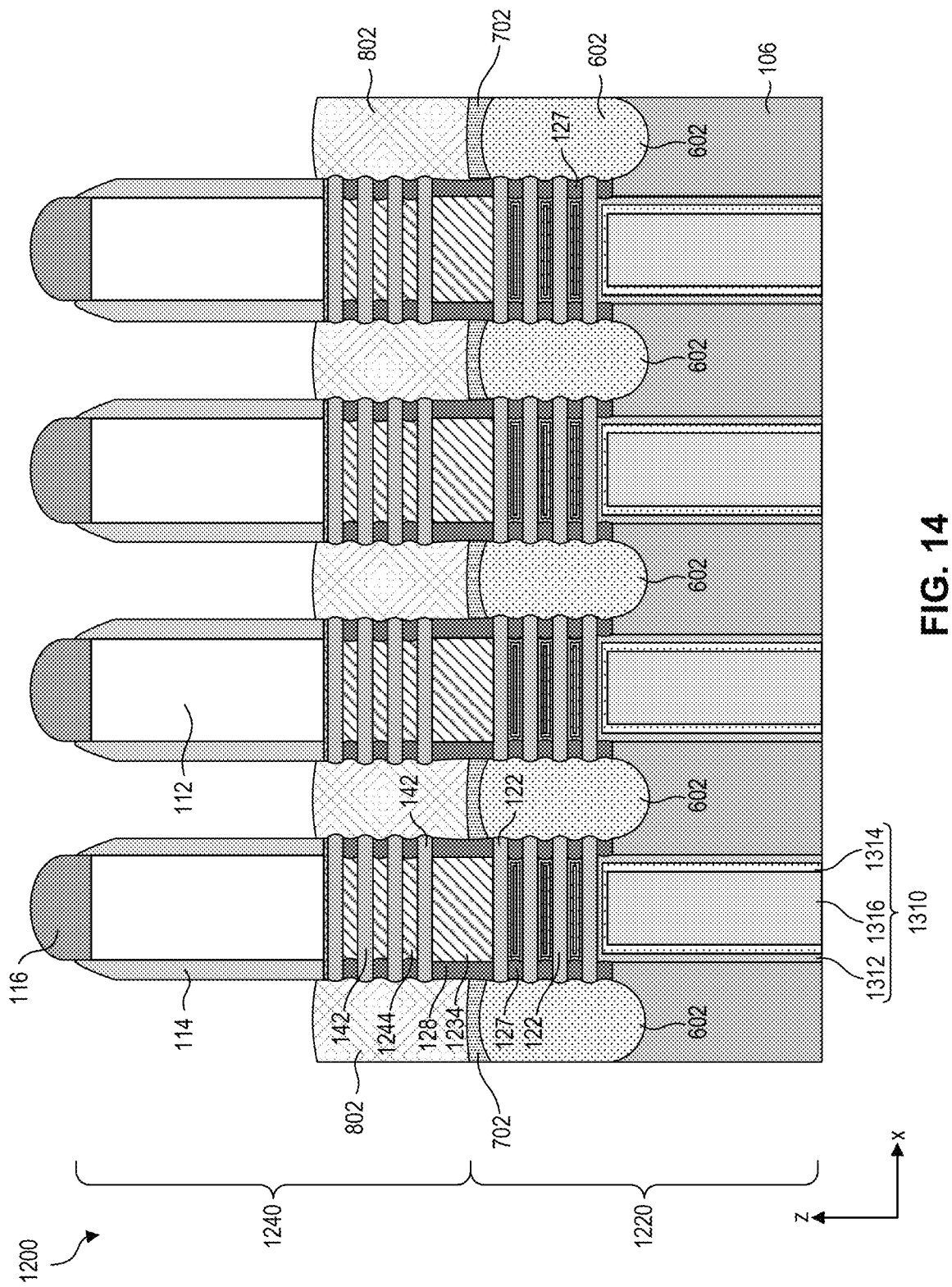

FIG. 14 illustrates semiconductor structure 1300 after gate structures for lower level semiconductor devices 1220 are formed, according to some embodiments. Lower gate structures 1310 including gate dielectric layer 1312, work function layer 1314, and gate electrode 1316 can be formed using materials similar to those of gate dielectric layer 812, work function layer 814, and gate electrode 816, respectively, and are not described in detail herein for simplicity. Lower gate structures 1310 can be formed in substrate 106 and between adjacent semiconductor layers 122. In some embodiments, lower gate structures 1310 can completely fill the openings between adjacent semiconductor layers 122. In some embodiments, gate dielectric layer 1312, work function layer 1314, and gate electrode 1316 can be formed using suitable deposition methods, such as CVD and ALD.

Figure 15:
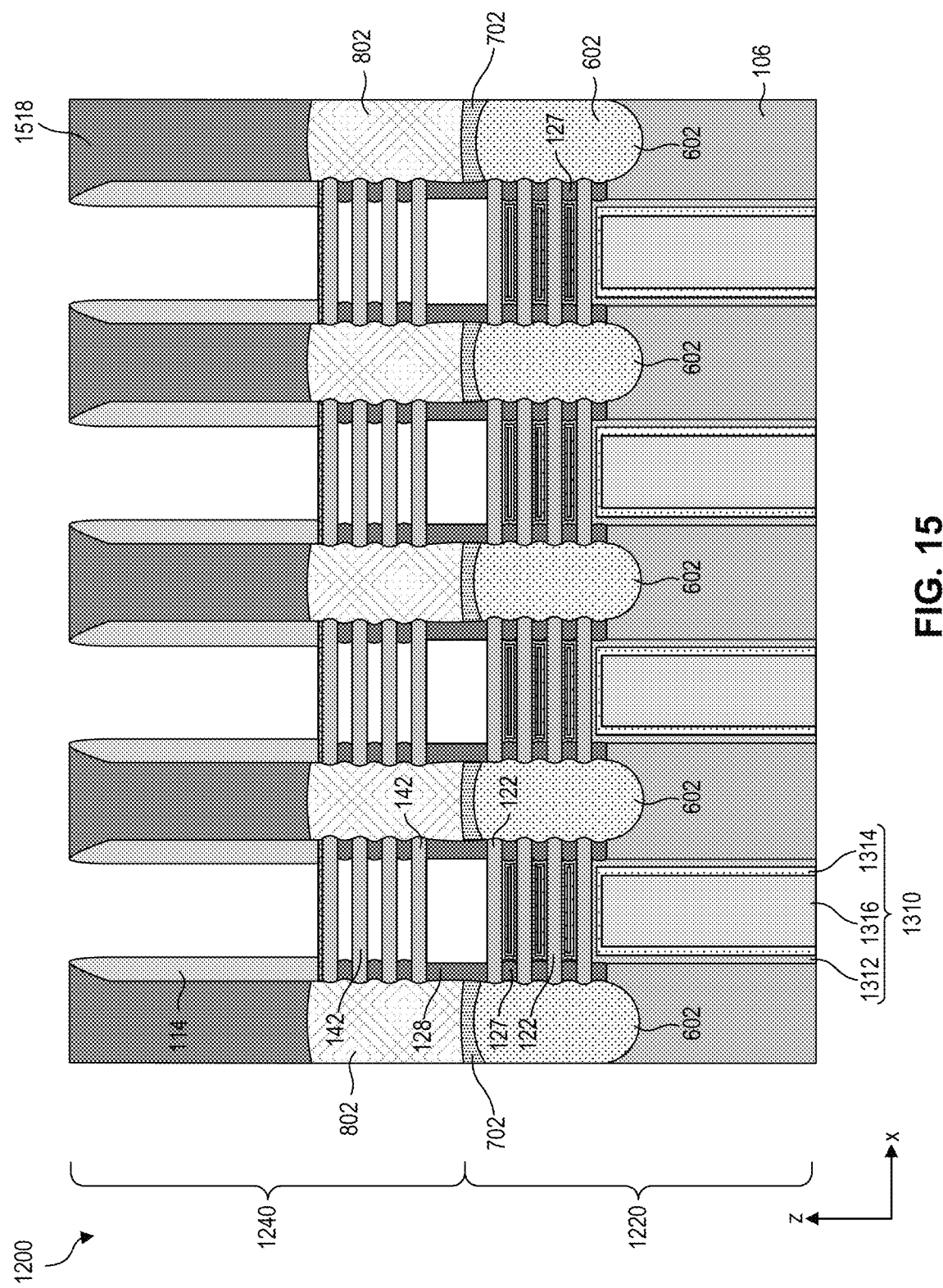

FIG. 15 illustrates semiconductor structure 1200 after an ILD layer is deposited and polysilicon gate structures, isolation structures, and semiconductor layers for upper level semiconductor devices 1240 are removed, according to some embodiments. As shown in FIG. 15, ILD layer 1518 can be deposited between spacers 114 and on upper level epitaxial structures 802. In some embodiments, ILD layer 1518 can be formed of a similar material and using a similar fabrication process as ILD layer 718, and are not described in detail herein for simplicity. Polysilicon gate structures 112, hard mask layer 116, and semiconductor layer 1244 can be removed to expose portions of semiconductor layers 142. In some embodiments, isolation structures 1234 and semiconductor layers 1244 are formed using similar materials and can be removed using the same etching processes. For example, isolation structures 1234 and semiconductor layers 1244 can be formed using silicon germanium material having similar germanium atomic concentrations. In some embodiments, isolation structures 1234 and semiconductor layers 1244 can both be formed using silicon carbide or a compound including silicon, germanium, and tin. Since isolation structures 1234 and semiconductor layers 1244 formed using the same material will react to etchants similarly, a plasma dry etching process or a wet chemical etching process can be used to remove both structures simultaneously, exposing underlying semiconductor layers 142.

Figure 16:
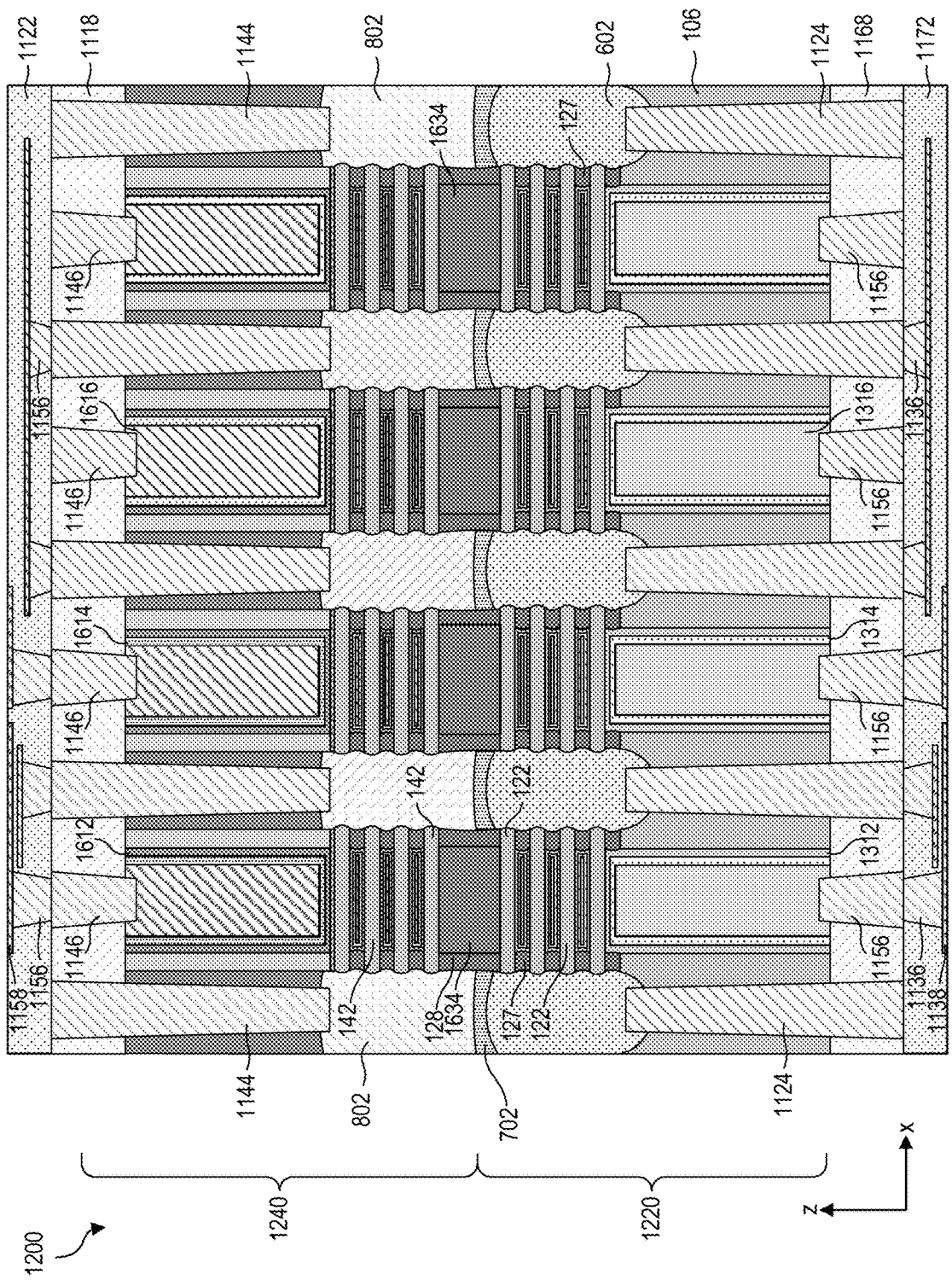

FIG. 16 illustrates semiconductor structure 1200 after upper gate structures, source/drain contacts, and gate contacts are formed, according to some embodiments. In some embodiments, isolation structure 1634 can be formed prior to the formation of upper gate structures and contact structures. Isolation structures 1634 can be formed by a deposition/etch back process similar to those for isolation structure 934 described with reference to FIG. 9. For example, isolation structure 1634 can be formed by blanket depositing an isolation material and etching back the isolation material such that isolation material remains between opposing spacers 128 and in contact with the bottommost layer of semiconductor layers 142 and the topmost layer of semiconductor layers 122. Upper gate structures including gate dielectric layer 1612, work function layer 1614, and gate electrode 1616 can be formed after isolation structures 1634 are formed. Similar to upper gate structures 1010 described in FIG. 10, upper gate structures described in FIG. 16 can be formed between spacers 114 and between adjacent semiconductor layers 142. Source/drain contacts, gate contacts, and BEOL structures for providing electrical contacts to lower and upper level semiconductor devices 1220 and 1240 are illustrated in FIG. 16. The aforementioned structures can be similar to those described with reference to FIG. 11 and are not described herein for simplicity.

FIGS. 17-21 illustrate semiconductor structure 1700 having various stacked semiconductor devices, according to some embodiments. The stacked semiconductor devices illustrated in FIGS. 17-21 can be formed using fabrication methods described in FIG. 1 and with a selective nanostructure release process. Different from the nanostructure releasing process described in FIG. 7 where nanostructures for lower and higher level semiconductor devices are simultaneously released (e.g., exposed by removing covering material), nanostructures for upper and lower level semiconductor devices in FIGS. 17-21 are released using different etching processes. Using sacrificial semiconductor layers having different etching selectivity can increase yield and reliability during the nanostructure release process. Reference numerals in FIGS. 17-20 generally indicate identical, functionally similar, and/or structurally similar elements.

Figure 17:
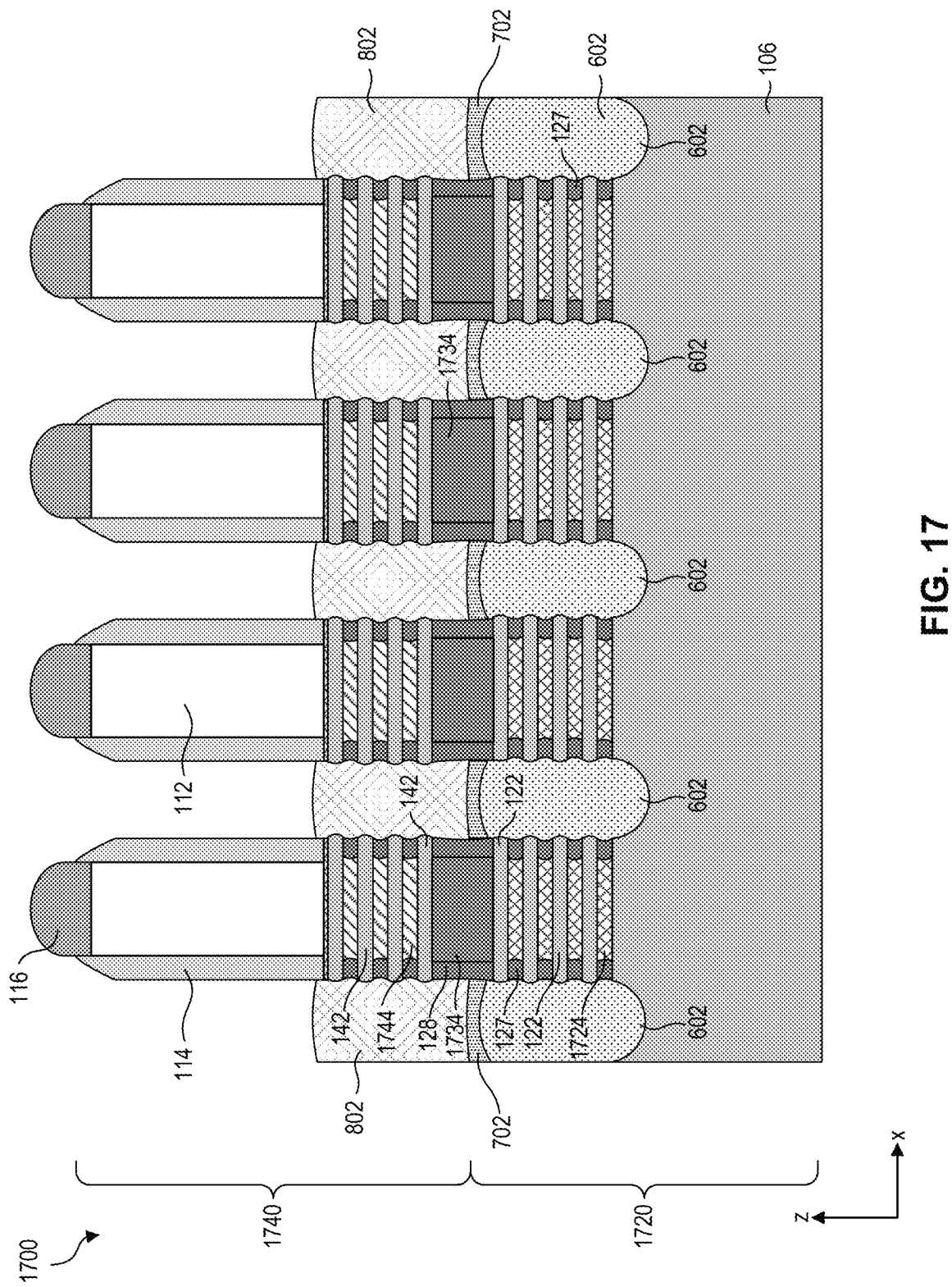

FIG. 17 illustrates semiconductor structure 1700 including lower level semiconductor devices 1720 and upper level semiconductor devices 1740. Isolation structure 1734 can be formed between semiconductor layers 122 and 142. Semiconductor layers for lower level semiconductor devices 1720 can be formed using alternatingly-stacked semiconductor layers 1724 and semiconductor layers 122. Semiconductor layers for upper level semiconductor devices 1740 can be formed using alternatingly-stacked semiconductor layers 1744 and semiconductor layers 142. Semiconductor layers 1724, semiconductor layers 1744, and isolation structures 1734 can be formed using different materials with high etching selectivity (e.g., greater than about 10). For example, semiconductor layers 1724 can be formed of silicon germanium with high germanium atomic concentration, whereas isolation structures 1734 can be formed of silicon germanium with low germanium atomic concentration, and whereas semiconductor layers 1744 can be formed using silicon carbide or a compound formed of silicon, germanium, and tin. In some embodiments, other suitable materials for forming the aforementioned structures can be used to provide different etching selectivity. The deposition process of semiconductor layers 1724, semiconductor layers 1744, and isolation structures 1734 can be similar to those of semiconductor layers 124, semiconductor layers 144, and isolation structures 134 described in FIGS. 2A-2C and are not described in detail herein for simplicity. For example, suitable deposition methods such as CVD, PVD, and ALD can be used.

Figure 18:
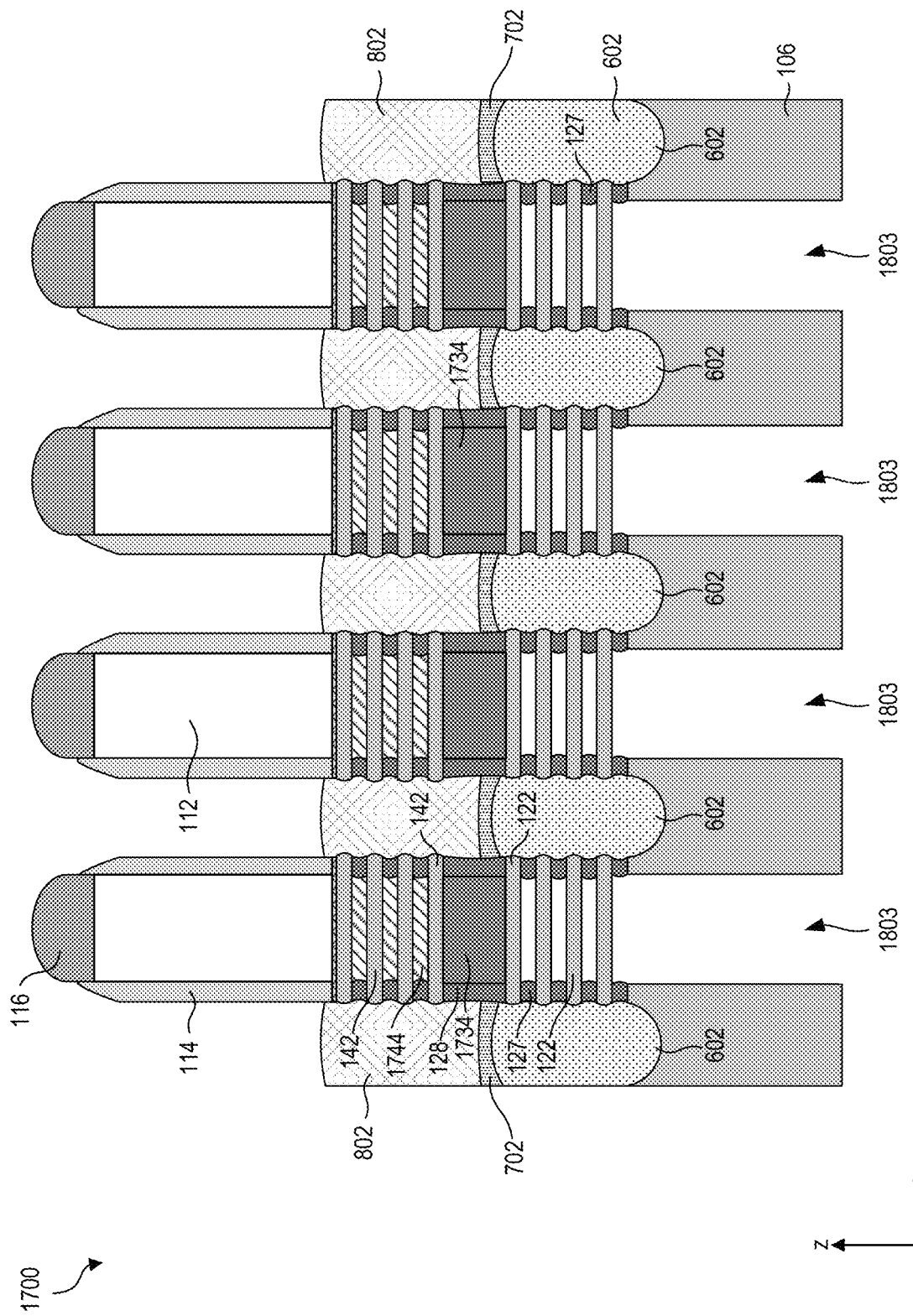

FIG. 18 illustrates semiconductor structure 1700 after nanostructures for lower level semiconductor devices 1720 are formed, according to some embodiments. Openings 1803 can be formed through substrate 106 and etching processes can be performed to remove semiconductor layers 1724. In some embodiments, the etching process can include a plasma etching process or a wet chemical etching process. For example, the gas etchants used in the dry etching process can include chlorine, fluorine, bromine, or a combination thereof. The nanostructures formed by exposing semiconductor layers 122 can be used as channels for lower semiconductor devices 1720.

Figure 19:
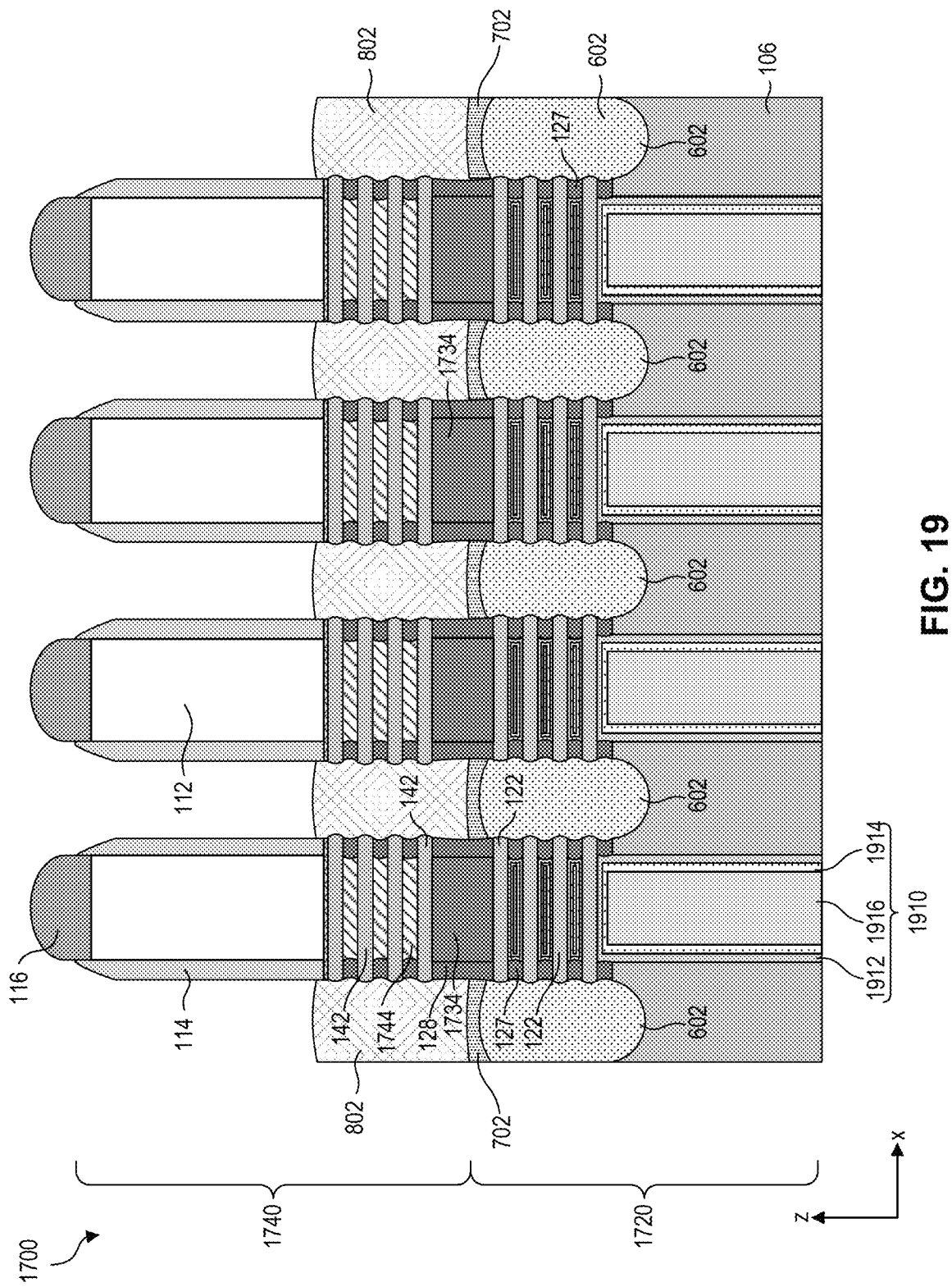

FIG. 19 illustrates semiconductor structure 1700 after gate structures for lower level semiconductor devices 1720 are formed, according to some embodiments. Lower gate structures 1910 including gate dielectric layer 1912, work function layer 1914, and gate electrode 1916 can be formed using materials similar to those of gate dielectric layer 812, work function layer 814, and gate electrode 816, respectively, and are not described in detail herein for simplicity. Lower gate structures 1910 can be formed in substrate 106 and between adjacent semiconductor layers 122. In some embodiments, lower gate structures 1910 can completely fill the openings between adjacent semiconductor layers 122. In some embodiments, gate dielectric layer 1912, work function layer 1914, and gate electrode 1916 can be formed using suitable deposition methods, such as CVD and ALD.

Figure 20:
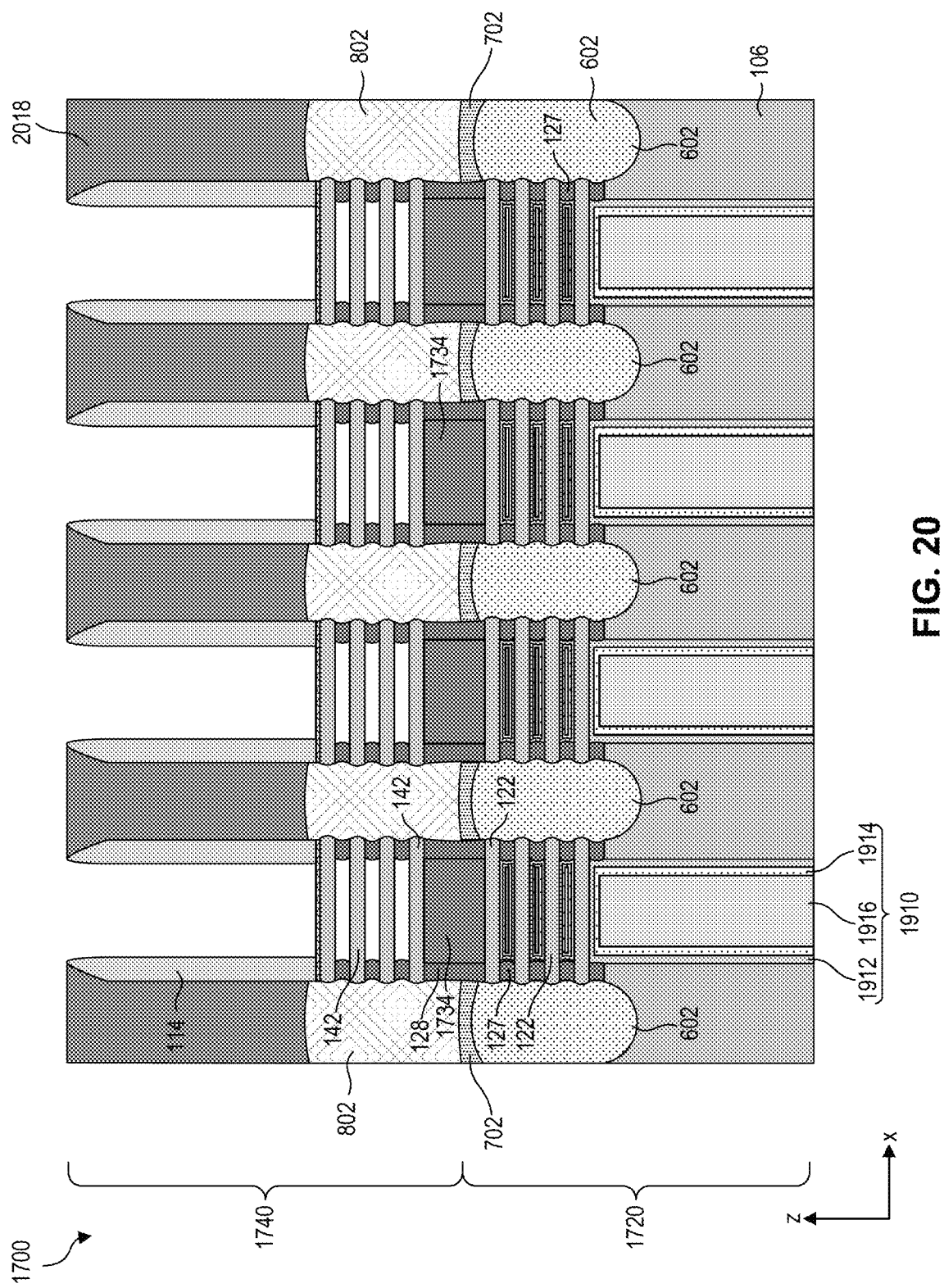

FIG. 20 illustrates semiconductor structure 1700 after an ILD layer is deposited and polysilicon gate structures and semiconductor layers for upper level semiconductor devices 1740 are removed, according to some embodiments. As shown in FIG. 20, ILD layer 2018 can be deposited between spacers 114 and on upper level epitaxial structures 802. In some embodiments, ILD layer 2018 can be formed of a similar material and using a similar fabrication process as ILD layer 718, and are not described in detail herein for simplicity. Polysilicon gate structures 112, hard mask layer 116, and semiconductor layer 1744 can be removed to expose portions of semiconductor layers 142. In some embodiments, semiconductor layers 1744 and isolation structures 1734 are formed using different materials and can be removed using different etching processes. For example, semiconductor layers 1744 formed using silicon carbide can be removed leaving isolation structures 1734 formed using silicon germanium material with low germanium atomic concentration. In some embodiments, isolation structures 1734 can have germanium atomic concentration between about 10% and about 30%, between about 15% and about 25%, or any suitable concentrations. Hard mask layer 116 and polysilicon gate structures 112 can be removed prior to the removal of semiconductor layers 1744 using etching methods similar to those described in FIGS. 7 and 15 and are not described in detail herein for simplicity.

Figure 21:
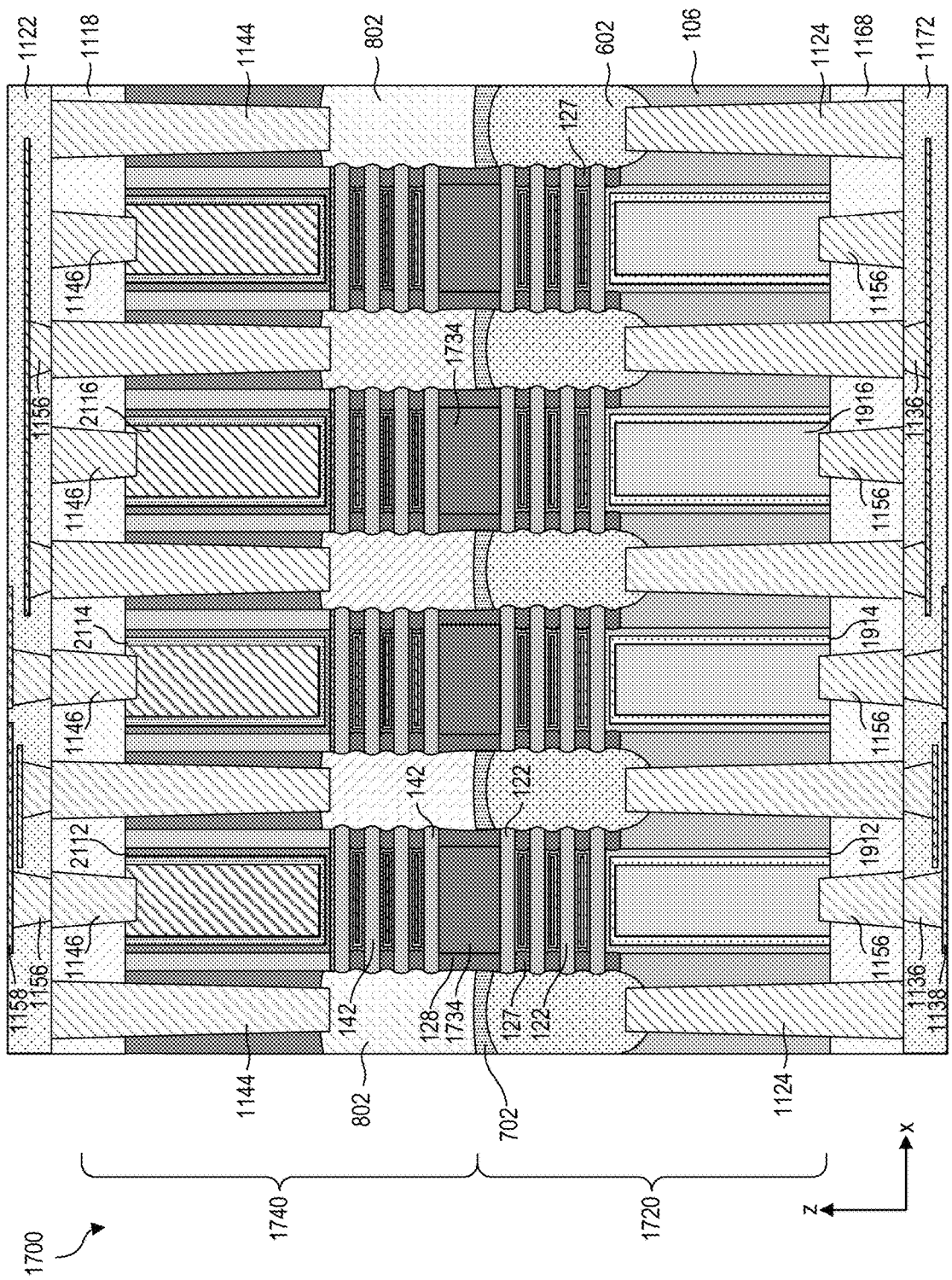

FIG. 21 illustrates semiconductor structure 1700 after upper gate structures, source/drain contacts, and gate contacts are formed, according to some embodiments. Upper gate structures including gate dielectric layer 2112, work function layer 2114, and gate electrode 2116 can be formed on semiconductor layers 142 and between opposing spacers 114. Source/drain contacts, gate contacts, and BEOL structures for providing electrical contacts to lower and upper level semiconductor devices 1720 and 1740 are illustrated in FIG. 21. The aforementioned structures can be similar to those described with reference to FIG. 11 and are not described herein for simplicity.

Various embodiments in the present disclosure describe methods for forming stacked semiconductor devices having stacked gate structures and gate isolation structures. The stacked semiconductor devices can include an upper level semiconductor device (e.g., an n-type GAAFET device) stacked on top of a lower level semiconductor device (e.g., a p-type GAAFET device). In some embodiments, a p-type FET device can be stacked over an n-type FET device. Gate structures for the upper and lower level semiconductor devices can be formed by a multi-step gate formation process. In some embodiments, nanostructures for both upper and lower level semiconductor devices can be released (e.g., exposed by removing covering material) and an initial gate structure is formed for both upper and lower level semiconductor devices. The initial gate structure formed on the upper level semiconductor devices can be removed and replaced with an upper level gate structure. The remaining initial gate structure in the lower level semiconductor devices can form the lower level gate structure. In some embodiments, nanostructures for upper and lower level semiconductor devices can be selectively removed in separate fabrication steps, and upper and lower level gate structures can be respectively formed. The nanostructures for the upper and lower level semiconductor devices can be released simultaneously or during separate etching processes.

In some embodiments, a semiconductor device includes a first transistor device of a first type and a second transistor device of a second type. The first transistor device includes first nanostructures, a first pair of source/drain structures, and a first gate structure on the first nanostructures. The second transistor device of a second type is formed over the first transistor device. The second transistor device includes second nanostructures over the first nanostructures, a second pair of source/drain structures over the first pair of source/drain structures, and a second gate structure on the second nanostructures and over the first nanostructures. The semiconductor device further includes a first isolation structure in contact with the first and second nanostructures and a second isolation structure in contact with a top surface of the first pair of source/drain structures.

In some embodiments, a semiconductor structure includes a first transistor device and a second transistor device. The first transistor device includes first nanostructures, a first gate dielectric layer wrapping around each nanostructure of the first nanostructures, a first work function layer on the first gate dielectric layer, a first gate electrode on the first work function layer, and a first source/drain region in contact with the first nanostructures. The second transistor device includes second nanostructures, a second gate dielectric layer, a second work function layer on the second gate dielectric layer, a second gate electrode on the second work function layer, and a second source/drain region in contact with the second nanostructures. The semiconductor structure also includes a gate isolation structure between the first and second nanostructures. The gate isolation structure is in contact with a topmost nanostructure of the first nanostructures and a bottommost nanostructure of the second nanostructures.

In some embodiments, a method includes forming first semiconductor layers on a substrate and forming a first isolation layer on the first semiconductor layers. The method also includes forming second semiconductor layers on the first semiconductor layers and removing portions of the first semiconductor layers to form first nanostructures. The method further includes forming a first gate structure on the first nanostructures and removing the first isolation layer. The method also includes removing portions of the second semiconductor layers to form second nanostructures and depositing a second isolation layer between the first and second nanostructures. The method further includes forming a second gate structure on the second nanostructures.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first transistor device of a first type, comprising:
   a first plurality of nanostructures;
   a first pair of source/drain structures; and
   a first gate structure on the first plurality of nanostructures;
   a second transistor device of a second type formed over the first transistor device, the second transistor device comprising:
   a second plurality of nanostructures over the first plurality of nanostructures;
   a second pair of source/drain structures over the first pair of source/drain structures; and
   a second gate structure on the second plurality of nanostructures and over the first plurality of nanostructures;
   a first isolation structure in contact with the first and second pluralities of nanostructures; and
   a second isolation structure in contact with a top surface of the first pair of source/drain structures.

2. The semiconductor device of claim 1, wherein the first transistor device comprises a p-type field effect transistor (PFET) and the second transistor device comprises an n-type field effect transistor (NFET).

3. The semiconductor device of claim 1, wherein the first transistor device comprises an n-type field effect transistor (NFET) and the second transistor device comprises a p-type field effect transistor (PFET).

4. The semiconductor device of claim 1, further comprising a plurality of spacers, wherein a spacer of the plurality of spacers is formed between adjacent nanostructures of the first plurality of nanostructures.

5. The semiconductor device of claim 1, further comprising a pair of spacers formed on sidewalk of the first isolation structure.

6. The semiconductor device of claim 5, wherein the second isolation structure is in contact with a spacer of the pair of spacers.

7. The semiconductor device of claim 5, wherein the pair of spacers is in contact with the first and second pluralities of nanostructures.

8. The semiconductor device of claim 1, wherein a width of the first isolation structure is less than a width of a nanostructure of the first plurality of nanostructures.

9. The semiconductor device of claim 1, wherein the first isolation structure is in contact with a topmost nanostructure of the first plurality of nanostructures and a bottommost nanostructure of the second plurality of nanostructures.

10. The semiconductor device of claim 1, wherein the second isolation structure is in contact with a bottom surface of the second pair of source/drain structures.

11. A semiconductor structure, comprising:
    a first transistor device, comprising:
    a first plurality of nanostructures;

a first gate dielectric layer wrapping around each nanostructure of the first plurality of nanostructures;
a first work function layer on the first gate dielectric layer;
a first gate electrode on the first work function layer; and
a first source/drain region in contact with the first plurality of nanostructures;
a second transistor device, comprising:
a second plurality of nanostructures;
a second gate dielectric layer;
a second work function layer on the second gate dielectric layer;
a second gate electrode on the second work function layer; and
a second source/drain region in contact with the second plurality of nanostructures; and
a gate isolation structure between the first and second pluralities of nanostructures, wherein the gate isolation structure is in contact with a topmost nanostructure of the first plurality of nanostructures and a bottommost nanostructure of the second plurality of nanostructures.

12. The semiconductor structure of claim 11, wherein the first transistor device comprises a p-type field effect transistor (PFET) and the second transistor device comprises an n-type field effect transistor (NFET).

13. The semiconductor structure of claim 11, wherein the first transistor device comprises an n-type field effect transistor (NFET) and the second transistor device comprises a p-type field effect transistor (PFET).

14. The semiconductor structure of claim 11, further comprising a source/drain isolation structure between the first and second source/drain regions.

15. The semiconductor structure of claim 14, further comprising a pair of spacers formed on sidewalls of the gate isolation structure, wherein the source/drain isolation structure is in contact with a spacer of the pair of spacers.

16. A method, comprising:
forming a first plurality of semiconductor layers on a substrate;
forming a first isolation layer on the first plurality of semiconductor layers;
forming a second plurality of semiconductor layers on the first isolation layer;
removing portions of the first plurality of semiconductor layers to form a first plurality of nanostructures;
forming a first gate structure on the first plurality of nanostructures;
removing the first isolation layer;
removing portions of the second plurality of semiconductor layers to form a second plurality of nanostructures;
depositing a second isolation layer between the first and second pluralities of nanostructures; and
forming a second gate structure on the second plurality of nanostructures.

17. The method of claim 16, wherein forming the first isolation layer comprises depositing silicon carbide.

18. The method of claim 16, wherein forming the first isolation layer comprises depositing a silicon germanium material, and wherein a germanium atomic concentration of the silicon germanium material is between about 15% and about 25%.

19. The method of claim 16, wherein forming the first isolation layer comprises depositing a compound comprising silicon, germanium, and tin.

20. The method of claim 16, wherein removing the first isolation layer and removing the portions of the second plurality of semiconductor layers are performed during a same etching process.

* * * * *

UNITED STATES PATENT AND TRADEMARK OFFICE
CERTIFICATE OF CORRECTION

PATENT NO. : 11,776,960 B2
APPLICATION NO. : 17/461329
DATED : October 3, 2023
INVENTOR(S) : Khaderbad et al.

Page 1 of 1

It is certified that error appears in the above-identified patent and that said Letters Patent is hereby corrected as shown below:

In the Claims

In Column 20, Claim 5, Line 47, delete "sidewalk" and insert -- sidewalls --, therefor.

Signed and Sealed this
Fourteenth Day of November, 2023

Katherine Kelly Vidal
*Director of the United States Patent and Trademark Office*